(12) United States Patent
Ajichi

(10) Patent No.: US 10,466,534 B2
(45) Date of Patent: Nov. 5, 2019

(54) BACKLIGHT DEVICE, AND DISPLAY APPARATUS INCLUDING SAME

(71) Applicant: SHARP KABUSHIKI KAISHA, Sakai, Osaka (JP)

(72) Inventor: Yuhsaku Ajichi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/098,443

(22) PCT Filed: Mar. 15, 2017

(86) PCT No.: PCT/JP2017/010509
§ 371 (c)(1),
(2) Date: Nov. 2, 2018

(87) PCT Pub. No.: WO2017/191714
PCT Pub. Date: Nov. 9, 2017

(65) Prior Publication Data
US 2019/0146277 A1    May 16, 2019

(30) Foreign Application Priority Data
May 6, 2016 (JP) ................. 2016-093050

(51) Int. Cl.
*G09F 13/04* (2006.01)
*G02F 1/1335* (2006.01)
(Continued)

(52) U.S. Cl.
CPC .......... *G02F 1/133606* (2013.01); *F21V 9/30* (2018.02); *G02F 1/133603* (2013.01);
(Continued)

(58) Field of Classification Search
CPC ........ G02F 1/133606; G02F 1/133608; G02F 1/133605; G02F 1/133611; G02F 1/1335;
(Continued)

(56) References Cited

U.S. PATENT DOCUMENTS

2012/0050645 A1* 3/2012 Okada ............... G02F 1/133608
349/64
2012/0147295 A1 6/2012 Kasano et al.
(Continued)

FOREIGN PATENT DOCUMENTS

| JP | 2012-048168 A1 | 3/2012 |
| JP | 2015-032373 A | 2/2015 |

(Continued)

*Primary Examiner* — Ali Alavi
(74) *Attorney, Agent, or Firm* — ScienBiziP, P.C.

(57) ABSTRACT

Occurrence of coloration at a screen end portion is suppressed when a backlight device having a configuration combining a blue LED and a wavelength conversion sheet is adopted.

In a backlight device (600) adopting a configuration combining a blue LED (63) and a phosphor sheet (65) in order to obtain white light, a reflection partition (67) is provided on an LED substrate (62) so as to surround the blue LED (63) (more specifically, so as to surround an LED unit including one or a plurality of blue LEDs (63)). A surface of the reflection partition (67) is formed of a reflection material. A height and an angle of the reflection partition (67) is designed so that light emitted from the blue LED (63) corresponding to each area does not reach other areas.

5 Claims, 28 Drawing Sheets

(51) Int. Cl.
  *F21V 9/30* (2018.01)
  *H01L 33/50* (2010.01)
  *H01L 33/60* (2010.01)

(52) U.S. Cl.
  CPC .. *G02F 1/133605* (2013.01); *G02F 1/133611* (2013.01); *H01L 33/502* (2013.01); *G02F 1/133608* (2013.01); *H01L 33/60* (2013.01)

(58) Field of Classification Search
  CPC . H01L 25/0753; H01L 33/502; H01L 33/505; F21V 9/30
  USPC ........................................... 362/97.2
  See application file for complete search history.

(56) References Cited

U.S. PATENT DOCUMENTS

2015/0036317 A1  2/2015  Yamamoto et al.
2015/0300576 A1* 10/2015 Matsuura .......... G02F 1/133603
                                            362/97.1

FOREIGN PATENT DOCUMENTS

JP    2015-216104 A   12/2015
WO    2012/035760 A1   3/2012

* cited by examiner

BACKLIGHT DEVICE, AND DISPLAY APPARATUS INCLUDING SAME

TECHNICAL FIELD

The following disclosure relates to a backlight device, and more specifically to a backlight device that obtains white light by a combination of a blue light emitting diode (LED) and a wavelength conversion sheet and a display apparatus including the same.

BACKGROUND ART

In a liquid crystal display apparatus for displaying a color image, a color is displayed by an additive color mixture of three primary colors. Therefore, in a transmissive liquid crystal display apparatus, a backlight device capable of irradiating a liquid crystal panel with white light including a red component, a green component, and a blue component is required. In the related art, a cold cathode fluorescent tube called a CCFL has been widely adopted as a light source of the backlight device. However, in recent years, adoption of an LED is increasing from viewpoints of lower power consumption and easiness of luminance control. For example, the backlight device having a configuration using a red LED, a green LED, and the blue LED as a light source has been known in the related art.

In recent years, as a technique for realizing widening of color gamut, a technique of obtaining white light by combining the blue LED and a phosphor sheet is gaining attention. The phosphor sheet adopted in the technique functions as a wavelength conversion sheet that converts a wavelength of light emitted from the blue LED so as to obtain white light. In order to realize this, the phosphor sheet contains a phosphor (fluorochrome) that is excited by the light emitted from the blue LED and emits light. Specific examples of the phosphor sheet to be used include a phosphor sheet including a yellow phosphor, or a phosphor sheet including a green phosphor and a red phosphor. There is known a backlight device having a configuration using a white LED (white LED package) with a configuration in which the blue LED is covered with the yellow phosphor as a light source.

FIG. 25 is a side view showing a schematic configuration of a backlight device that obtains white light by a combination of a blue LED and a phosphor sheet (wavelength conversion sheet) in the related art. The backlight device includes a plurality of blue LEDs 93 as a light source, an LED substrate 92 on which the plurality of blue LEDs 93 are mounted, a diffuser plate 94 that diffuses light emitted from the blue LEDs 93 and flatly uniformizes the light, a phosphor sheet 95 that converts a wavelength of the light emitted from the blue LEDs 93 so as to obtain white light, an optical sheet 96 that improves light utilization efficiency, and a chassis that supports the LED substrate 92 and the like. Note that, the chassis is not illustrated in FIG. 25. In the configuration using the blue LED 93 as a light source, the phosphor sheet (for example, phosphor sheet including yellow phosphor) 95 is provided as shown in FIG. 25, so that white light is emitted from the backlight device as backlight light.

In relation to the present disclosure, for example, in Japanese Unexamined Patent Application Publication No. 2015-32373 discloses an disclosure of a light source apparatus that obtains white light by a combination of blue light source and a wavelength conversion sheet. In the light source apparatus disclosed in Japanese Unexamined Patent Application Publication No. 2015-32373, a diffusing member for uniformizing angular distribution of incident light is disposed between the blue light source and the wavelength conversion sheet in order to improve the quality of the illumination light.

CITATION LIST

Patent Literature

PTL 1: Japanese Unexamined Patent Application Publication No. 2015-32373

SUMMARY OF INVENTION

Technical Problem

However, according to the above-described configuration (see FIG. 25) in the related art, when full lighting (lightening up light source in all regions of display unit) is performed, there are some cases in which the color of backlight light at a screen end portion (end portion of display unit) has a bluer tinge than the color of the backlight light at a screen center portion (center portion of display unit). Therefore, the color of a display image at the screen end portion and the screen center portion may be different when the color at the screen end portion and the screen center portion need to display the same color. This will be described below while comparing a configuration using the white LED as a light source (hereinafter, simply referred to as "configuration using white LED") and a configuration that obtains white light by combining the blue LED and the phosphor sheet (hereinafter, simply referred to as "configuration using phosphor sheet).

FIGS. 26 to 28 are diagrams respectively showing luminance, chromaticity x, and chromaticity y when full lighting is performed in the configuration using the white LED. FIGS. 29 to 31 are diagrams respectively showing the luminance, the chromaticity x, and the chromaticity y when full lighting is performed in the configuration using the phosphor sheet. As can be seen from FIGS. 27 and 28, values of the chromaticity x and the chromaticity y are uniform over the entire screen in the configuration using the white LED. On the other hand, in the configuration using the phosphor sheet, as can be seen from FIGS. 30 and 31, the values of chromaticity x and chromaticity y are smaller at the screen end portion than in other regions (for example, value of portion denoted by arrow 98 is smaller than value of portion denoted by arrow 99 in FIG. 30). In this regard, in an xy chromaticity diagram, the blue chromaticity x is smaller than the white chromaticity x and the blue chromaticity y is smaller than the white chromaticity y. That is, in the configuration using the phosphor sheet, the color or the backlight light has a blue tinge at the screen end portion. As a result, a phenomenon called "coloration" (in this case, a phenomenon in which a more bluish color than the color to be originally displayed is displayed) occurs at the screen end portion.

Here, with reference to FIG. 32, the cause of the occurrence of the coloration in the configuration using the phosphor sheet will be explained. Light 9a emitted from the blue LED 93 passes through a phosphor sheet 95, and is divided into light (component) 9b passing through the optical sheet 96 and light (component) 9c reflected by the optical sheet 96. That is, some components of the light 9a emitted from the blue LED 93 are reflected by the optical sheet 96 and returns to the LED substrate 92 side. Since a reflection sheet that generally reflects the light is attached to a surface of the LED substrate 92, the light 9c reflected by the optical sheet 96 is further reflected by the LED substrate 92. The reflected light 9d passes through the phosphor sheet 95, and is divided into light 9e passing through the optical sheet 96 and light 9f reflected by the optical sheet 96. Similarly, the light 9f reflected by the optical sheet 96 is reflected by the LED substrate 92, and light 9g reflected by the LED substrate 92 is divided into light 9h passing through the optical sheet 96 and light 9i reflected by the optical sheet 96. As described above, when the reflection of light is repeated, the color of the light has a yellower tinge every time it passes through the phosphor sheet 95. Therefore, focusing on the light emitted from one blue LED 93, the color of the light has a yellower tinge as the region separates farther from the blue LED 93. In the example shown in FIG. 32, the color of the light 9e has a yellower tinge than the color of the light 9b, and the color of the light 9h has a further yellower tinge than the color of the light 9e.

As described above, the light emitted from one blue LED 93 reaches a surrounding region by repeating the reflection. In other words, some regions are not only irradiated with the light emitted from the blue LED 93 corresponding to the region, but also with the light of the reflection component of the light emitted from the blue LED 93 corresponding to surrounding region. In consideration of these points, the content (phosphor concentration) of phosphor in the phosphor sheet 95 is adjusted so that the backlight light becomes white light when the full lighting is performed. However, at the screen end portion, the amount of light that is mixed is smaller than in other regions. That is, at the screen end portion, the amount of reached light having a yellow tinge is smaller than other regions. Therefore, the color of the backlight light at the screen end portion will have a blue tinge, and the coloration will occur as described above.

Therefore, an object of the following disclosure is to suppress occurrence of coloration at a screen end portion when adopting a backlight device having a configuration combining a blue LED and a wavelength conversion sheet.

Solution to Problem

According to a first aspect of the present disclosure, there is provided a backlight device that is a direct backlight device, including: a light source unit that includes one or a plurality of blue light emitting elements which emit blue light; a wavelength conversion sheet that converts a wavelength of the light emitted from the blue light emitting element so that a color of light emitted to an outside becomes white; and a reflection partition that is provided so as to surround the light source unit.

According to a second aspect of the present disclosure, in the first aspect of the present disclosure, the backlight device further includes a diffuser plate that diffuses the light emitted from the blue light emitting element to a portion between the light source unit and the wavelength conversion sheet, in which the reflection partition is provided so that an upper end thereof is in contact with the diffuser plate.

According to a third aspect of the present disclosure, in the first aspect of the present disclosure, the backlight device further includes a diffuser plate that diffuses the light emitted from the blue light emitting element to a portion between the light source unit and the wavelength conversion sheet, in which a predetermined interval is provided between the upper end of the reflection partition and the diffuser plate.

According to a fourth aspect of the present disclosure, in the third aspect of the present disclosure, a surface of the reflection partition is blue.

According to a fifth aspect of the disclosure, in the first aspect of the present disclosure, the wavelength conversion sheet is a phosphor sheet including a phosphor which is excited by the light emitted from the blue light emitting element and emits light.

According to a sixth aspect of the disclosure, in the first aspect of the present disclosure, the wavelength conversion sheet is a quantum dot sheet including a quantum dot which converts the light emitted from the blue light emitting element into light having a green wavelength as an emission peak wavelength and a quantum dot which converts the light emitted from the blue light emitting element into light having a red wavelength as an emission peak wavelength.

According to a seventh aspect of the present disclosure, there is provided a display apparatus including: a display panel that includes a display unit which displays an image; the backlight device according to the first aspect of the present disclosure that is disposed so as to irradiate a back surface of the display panel with light; and a light source control unit that controls light emission intensity of the blue light emitting element.

According to an eighth aspect of the present disclosure, in the seventh aspect of the present disclosure, the display unit is logically divided into a plurality of areas, the light source unit is provided so as to correspond to each area, and the light source control unit controls the light emission intensity of a blue light emitting element included in the light source unit for each area.

Advantageous Effects of Invention

According to the first aspect of the present disclosure, in the backlight device adopting a configuration combining the blue light emitting element and the wavelength conversion sheet in order to obtain white light, a reflection partition is provided so as to surround the light source unit including one or a plurality of blue light emitting elements. Therefore, it is possible to suppress the light emitted from the blue light emitting element from reaching the surrounding region. In other words, light emitted from the blue light emitting element in other regions hardly reaches each region. Therefore, the entire screen of the display apparatus is irradiated with the backlight light having uniform chromaticity. That is, unlike the case in the related art, the screen end portion of the display apparatus is irradiated with light having the same chromaticity with the chromaticity of light emitted from other region. Accordingly, the occurrence of coloration at the screen end portion of the display apparatus is suppressed.

According to the second aspect of the present disclosure, the same effect as the first aspect of the present disclosure can be obtained while suppressing the increase in the thickness of the device.

According to the third aspect of the disclosure, the occurrence of unevenness in luminance caused by providing the reflection partition is suppressed.

According to the fourth aspect of the disclosure, the occurrence of color unevenness caused by leakage of light (leakage of light from one region to another region) caused by providing an interval between the reflection partition and the diffuser plate can be suppressed.

According to the fifth aspect of the present disclosure, the same effect as the first aspect of the present disclosure can be obtained.

According to the sixth aspect of the present disclosure, the half value width of the green light and the red light can be narrowed, and thereby widening of the color gamut can be realized.

According to the seventh aspect of the present disclosure, in the display apparatus adopting the backlight device having a configuration combining the blue light emitting element and the wavelength conversion sheet, occurrence of coloration at the screen end portion is suppressed.

According to the eighth aspect of the present disclosure, since the light emission intensity of the light source (blue light emitting element) can be independently controlled, low power consumption can be achieved. Moreover, it is possible to expand the dynamic range by causing the light source to emit light intensively at a high gray scale portion with high light emission intensity.

DESCRIPTION OF EMBODIMENTS

Hereinafter, an embodiment of the present disclosure will be described with reference to the accompanying drawings.

1. Overall Configuration and Operation Outline

Figure 1:
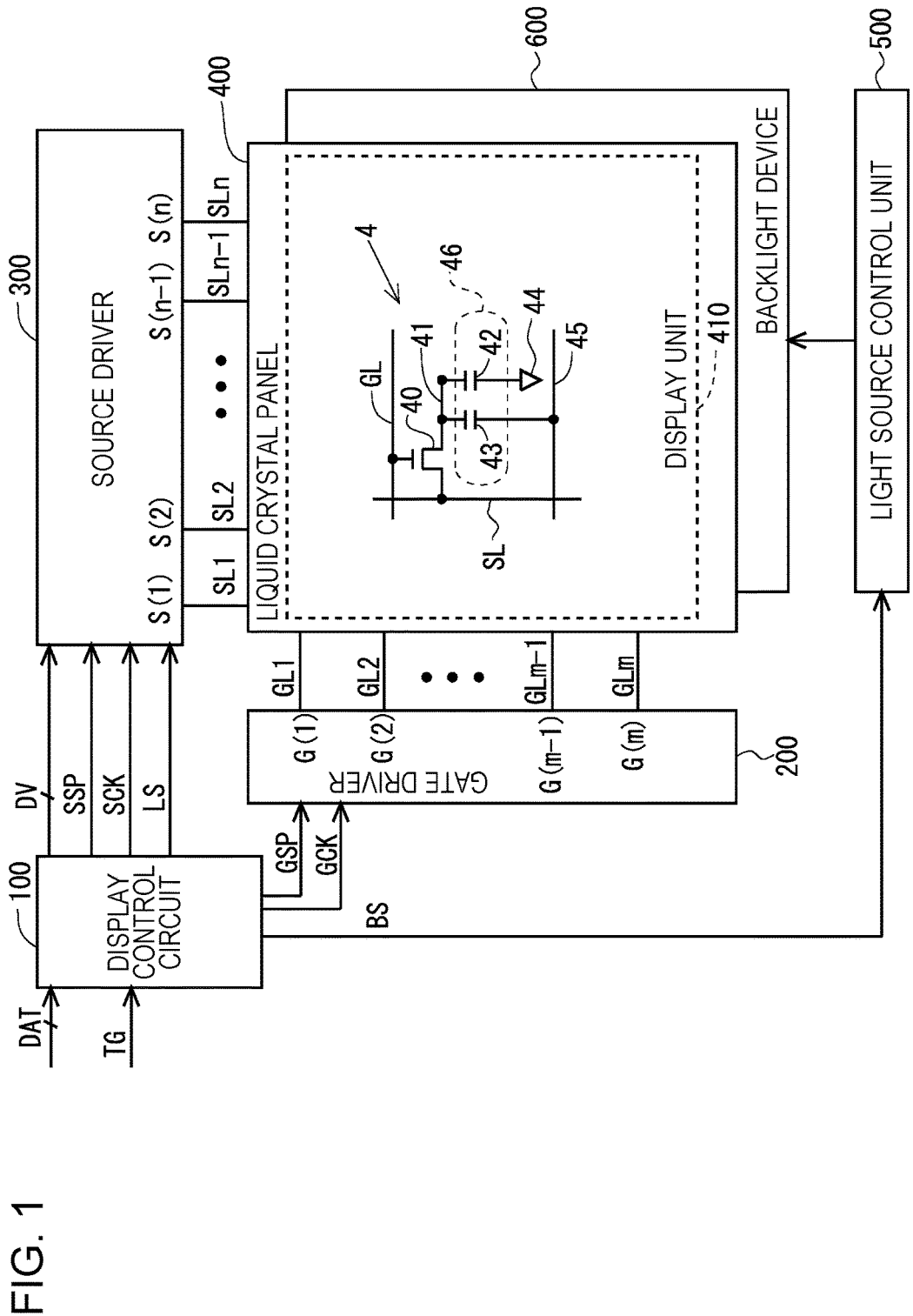
FIG. 1 is a block diagram showing an overall configuration of a liquid crystal display apparatus including a backlight device according to an embodiment of the present disclosure.

FIG. 1 is a block diagram showing an overall configuration of a liquid crystal display apparatus including a backlight device 600 according to the embodiment of the present disclosure. The liquid crystal display apparatus includes a display control circuit 100, a gate driver (scanning signal line drive circuit) 200, a source driver (video signal line drive circuit) 300, a liquid crystal panel 400, a light source control unit 500, and the backlight device 600. The liquid crystal panel 400 includes a display unit 410 that displays an image. The gate driver 200 or the source driver 300, or both may be provided in the liquid crystal panel 400.

Regarding FIG. 1, a plurality (n) of source bus lines (video signal lines) SL1 to SLn and a plurality (m) of gate bus lines (scanning signal lines) GL1 to GLm are arranged in the display unit 410. A pixel formation unit 4 that forms a pixel is provided corresponding to respective intersections of the source bus lines SL1 to SLn and the gate bus lines GL1 to GLm. That is, the display unit 410 includes a plurality (m×n) of pixel formation units 4. The plurality of pixel formation units 4 are arranged in a matrix and form a pixel matrix. Each of the pixel formation unit 4 includes a thin film transistor (TFT) 40 which is a switching element having a gate terminal connected to a gate bus line GL passing through a corresponding intersection and a source terminal connected to a source bus line SL passing through the corresponding intersection, a pixel electrode 41 connected to a drain terminal of the TFT 40, a common electrode 44 and an auxiliary capacity electrode 45 commonly provided for the plurality of pixel formation units 4, a liquid crystal capacity 42 formed by the pixel electrode 41 and the common electrode 44, and an auxiliary capacity 43 formed by the pixel electrode 41 and the auxiliary capacity electrode 45. A pixel capacity 46 includes the liquid crystal capacity 42 and the auxiliary capacity 43. In the display unit 410 in FIG. 1, only the components corresponding to one pixel formation unit 4 are shown.

Meanwhile, as the TFT 40 in the display unit 410, for example, an oxide TFT (a thin film transistor using an oxide semiconductor for a channel layer) can be adopted. More specifically, a TFT in which a channel layer is formed of In—Ga—Zn—O (indium gallium zinc oxide) which is an oxide semiconductor containing indium (In), gallium (Ga), zinc (Zn), and oxygen (O) as main components (hereinafter referred to as "In—Ga—Zn—O-TFT") can be adopted as the TFT 40. Adoption of such an In—Ga—Zn—O-TFT provides effects such as high definition and low power consumption. Alternatively, a transistor using an oxide semiconductor other than In—Ga—Zn—O (indium gallium zinc oxide) as a channel layer can be adopted. For example, the same effect can be obtained also in a case where a transistor using an oxide semiconductor including at least one of indium, gallium, zinc, copper (Cu), silicon (Si), tin (Sn), aluminum (Al), calcium (Ca), germanium (Ge), and lead (Pb) as a channel layer is adopted. Note that, the present disclosure does not exclude the use of TFTs other than oxide TFTs.

Next, the operation of the components shown in FIG. 1 will be described. The display control circuit 100 receives an image signal DAT and a timing signal group TG such as a horizontal synchronization signal and a vertical synchronization signal sent from an outside, and outputs a digital video signal DV, a gate start pulse signal GSP and a gate clock signal GCK for controlling the operation of the gate driver 200, a source start pulse signal SSP, a source clock signal SCK, and a latch strobe signal LS for controlling the operation of the source driver 300, and a light source control signal BS for controlling the operation of the light source control unit 500.

The gate driver 200 repeats applying active scanning signals G(1) to G(m) to each of the gate bus lines GL1 to GLm with one vertical scanning period as a cycle based on the gate start pulse signal GSP and the gate clock signal GCK sent from the display control circuit 100.

The source driver 300 receives the digital video signal DV, the source start pulse signal SSP, the source clock signal SCK, and the latch strobe signal LS sent from the display control circuit 100, and applies the driving video signals S(1) to S(n) to the source bus lines SL1 to SLn. At this time, in the source driver 300, the digital video signal DV indicating the voltage to be applied to each of the source bus lines SL1 to SLn is sequentially held at the timing when the pulse of the source clock signal SCK is generated. Then, at the timing when the pulse of the latch strobe signal LS is generated, the held digital video signal DV is converted into an analog voltage. The converted analog voltage is simultaneously applied to all the source bus lines SL1 to SLn as the driving video signals S(1) to S(n).

The light source control unit 500 controls the luminance (light emission intensity) of the light source in the backlight device 600 based on the light source control signal BS sent from the display control circuit 100. Accordingly, the backlight device 600 irradiates the back surface of the liquid crystal panel 400 with backlight light. In the present embodiment, local dimming processing is performed, which will be described later.

As described above, the scanning signals G(1) to G(m) are applied to the gate bus lines GL1 to GLm, the driving video signals S(1) to S(n) are applied to the source bus lines SL1 to SLn, and the luminance of the light source in the backlight device 600 is controlled, whereby an image corresponding to the image signal DAT sent from the outside is displayed on the display unit 410.

2. Outline of Backlight Device

Figure 2:
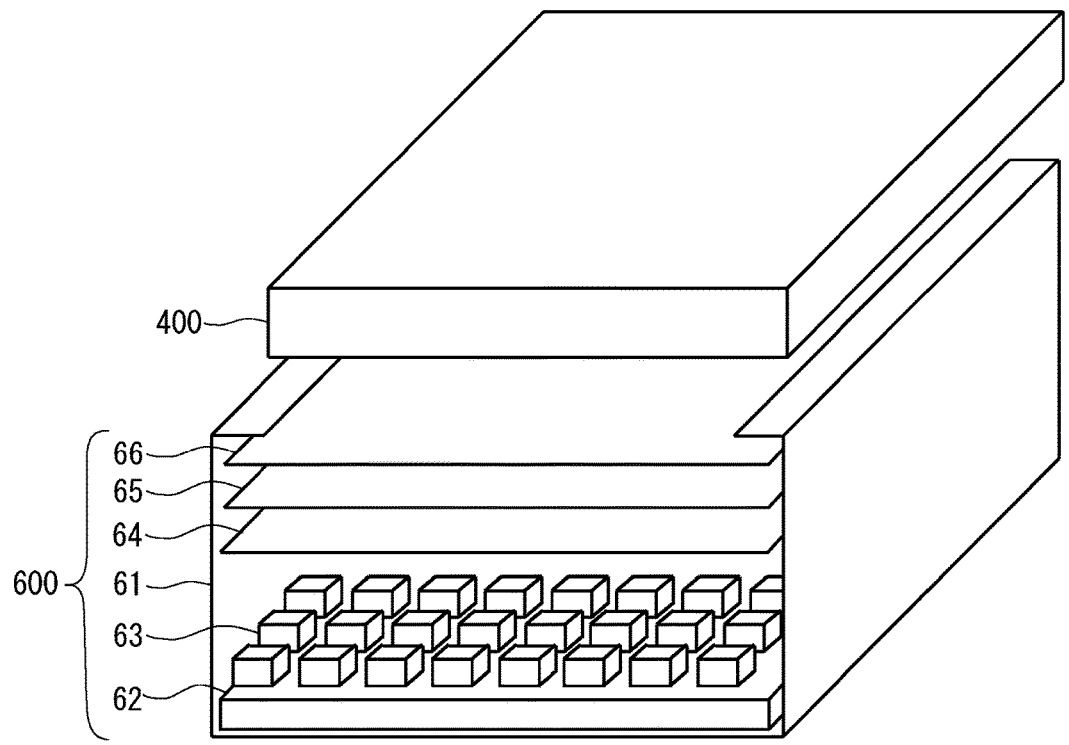
FIG. 2 is a perspective view of a liquid crystal panel and the backlight device in the embodiment.
Figure 3:
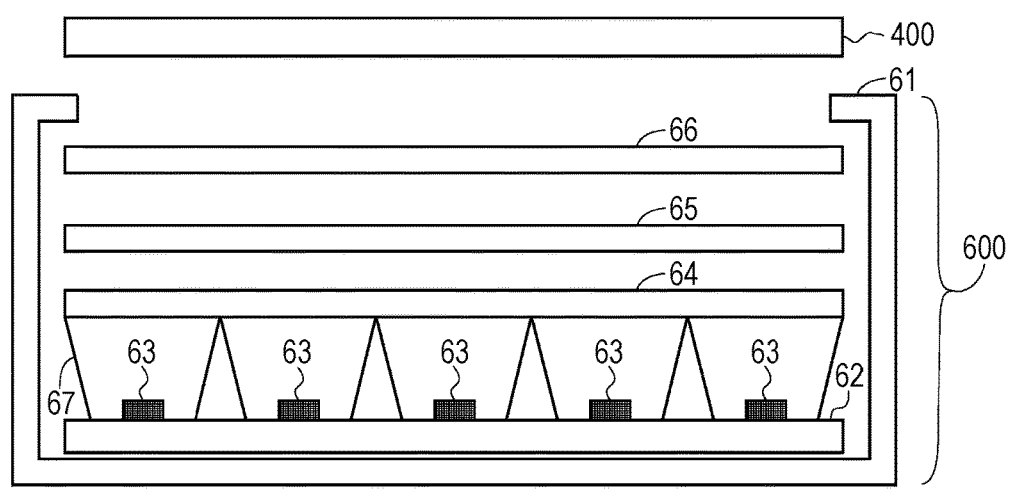
FIG. 3 is a side view of the liquid crystal panel and the backlight device in the embodiment.

FIG. 2 is a perspective view of the liquid crystal panel 400 and the backlight device 600. FIG. 3 is a side view of the liquid crystal panel 400 and the backlight device 600. In FIG. 2, the illustration of a reflection partition to be described later is omitted. The backlight device 600 is provided on the back surface of the liquid crystal panel 400. That is, the backlight device 600 in the present embodiment is a direct backlight device.

The backlight device 600 includes a chassis 61, an LED substrate 62, a plurality of the blue LEDs 63, a diffuser plate 64, a phosphor sheet 65, an optical sheet 66, and a reflection partition 67. The chassis 61 supports the LED substrate 62 and the like. The LED substrate 62 is, for example, a metal substrate and mounts the plurality of blue LEDs 63. A reflecting sheet is attached to the surface of the LED substrate 62 in order to enhance the utilization efficiency of the light emitted from the blue LED 63. The blue LED 63 is a light source of the backlight device 600, and emits blue light. The diffuser plate 64 is disposed at a position several mm to several cm above the blue LED 63. The diffuser plate 64 diffuses the light emitted from the blue LED 63 so that the backlight light becomes planarly uniform light. The phosphor sheet 65 is disposed above the diffuser plate 64. The phosphor sheet 65 converts the wavelength of the light emitted from the blue LED 63 so that the backlight light emitted from the backlight device 600 becomes white light. In order to realize this, the phosphor sheet 65 is provided with a yellow phosphor (alternatively, green phosphor emitting green light and red phosphor emitting red light) excited by light emitted from the blue LED 63 to emit yellow light. The optical sheet 66 is disposed above the phosphor sheet 65. Generally, the optical sheet 66 is composed of a plurality of sheets. Each of the plurality of sheets has a function of diffusing light, a condensing function, a function of enhancing light utilization efficiency, and the like. A description of the reflection partition 67 will be given later.

Figure 4:
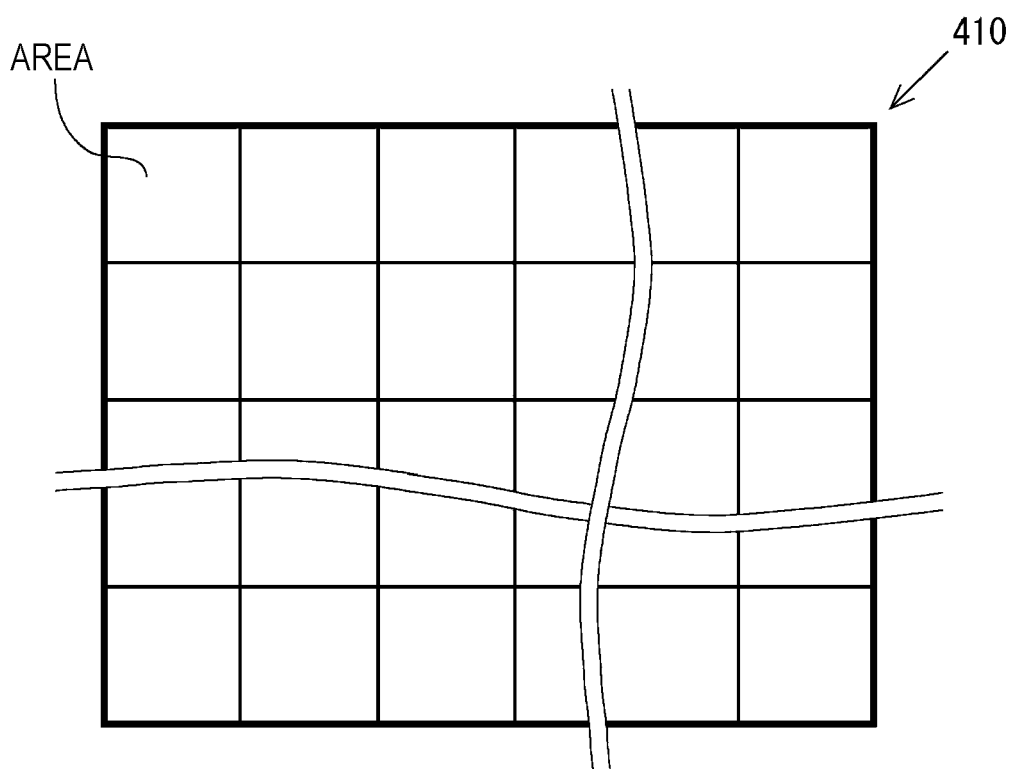
FIG. 4 is a diagram for explaining areas in the embodiment.
Figure 5:
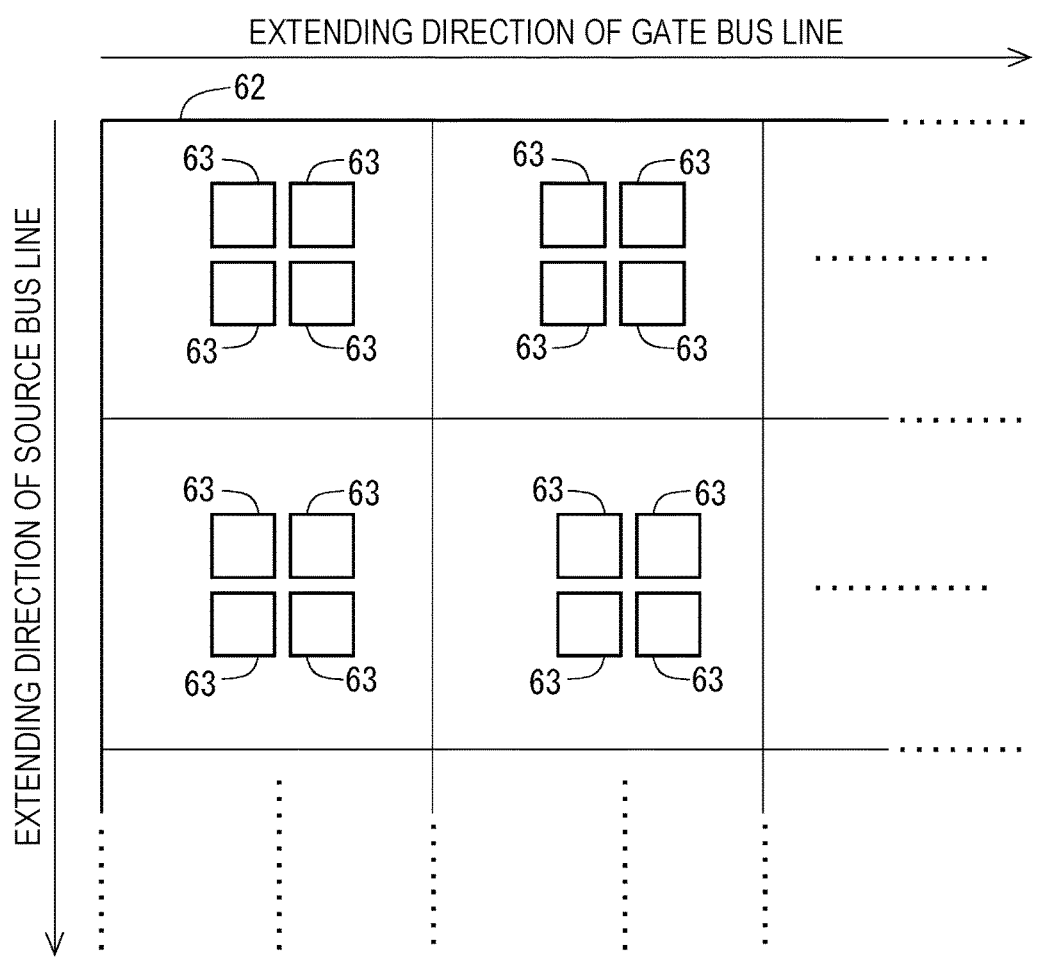
FIG. 5 is a diagram showing an arrangement state of blue LEDs on an LED substrate in the embodiment.

In the present embodiment, the display unit 410 for displaying an image is logically (not physically) divided into a plurality of areas (area to be the smallest unit for controlling light source) as shown in FIG. 4 in order to perform the local dimming processing to be described later. The blue LED 63 is provided so as to correspond to each area on the LED substrate 62. FIG. 5 is a diagram showing an arrangement state of the blue LEDs 63 on the LED substrates 62. As shown in FIG. 5, in the present embodiment, one organized LED unit (light source unit) is formed by four blue LEDs 63. Such LED units are arranged at equal intervals in a direction in which the gate bus line GL extends and are also arranged at equal intervals in a direction in which the source bus line SL extends. In this way, the LED unit including four blue LEDs 63 is provided for each area. In the present embodiment, four blue LEDs 63 are provided for each area. However, in FIG. 3 and the like, only one blue LED 63 is illustrated for each area for convenience.

3. Local Dimming Processing and Driving of Backlight Device

Regarding the liquid crystal display apparatus, reduction of power consumption has been a problem in the related art. In recent years, as shown in FIG. 4, a liquid crystal display apparatus which performs the local dimming processing for controlling luminance (light emission intensity) of the light source for each area where a screen is logically divided into a plurality of areas has been developed. In the local dimming processing, the luminance of the light source is controlled based on an input image in the corresponding area. Specifically, the luminance of each light source is obtained based on a maximum value and an average value of a target luminance (luminance corresponding to input gray scale value) of a pixel included in the corresponding area. In the area where the luminance of the light source is smaller than the original luminance, transmittance of each pixel is increased. Accordingly, the target display luminance can be obtained for each pixel. In the liquid crystal display apparatus according to the present embodiment, the above-described local dimming processing is performed. Furthermore, development of HDR drive for displaying an extremely dynamic display range has recently become active. The local dimming processing is also used to realize the HDR drive.

Figure 6:
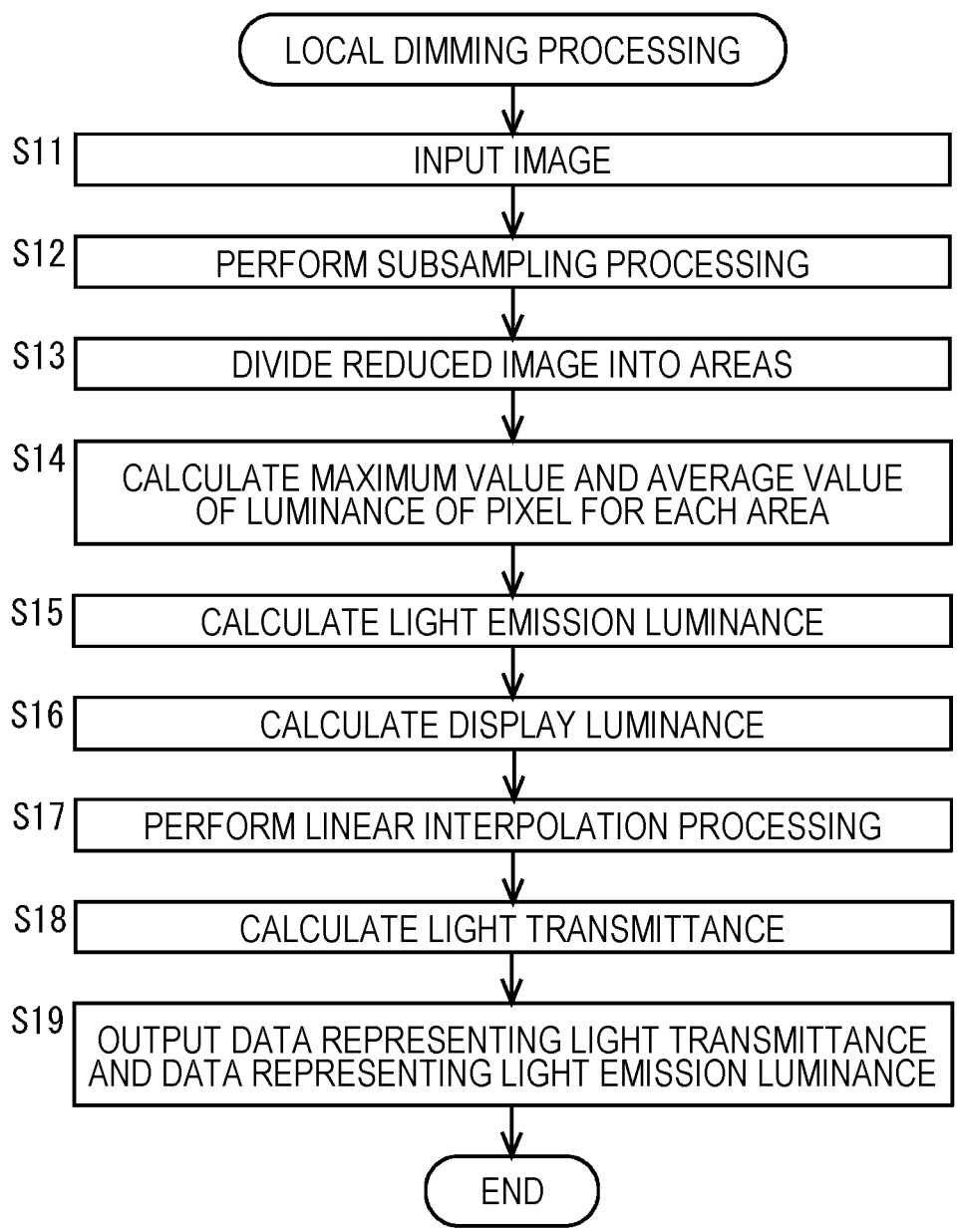
FIG. 6 is a flowchart showing an example of a procedure of local dimming processing in the embodiment.

Here, an example of the procedure of the local dimming processing will be described with reference to FIG. 6. The local dimming processing is performed by a local dimming processing unit (not shown) in the display control circuit 100 (see FIG. 1). Here, it is assumed that the display unit 410 is divided into (vertical p×horizontal q) areas.

First, the image signal DAT sent from the outside is input to the local dimming processing unit as input image data (step S11). The input image data includes the luminance (luminance data) of (m×n) pixels. Next, the local dimming processing unit performs subsampling processing (averaging processing) on the input image data to obtain a reduced image including the luminances of (sp×sq) pixels (s is an integer of 2 or more) (Step S12). Next, the local dimming processing unit divides the reduced image into data of (p×q) areas (step S13). The data of each area includes the luminance of (s×s) pixels. Next, for each of the (p×q) areas, the local dimming processing unit obtains a maximum value Ma of the luminances of the pixels in the area and an average value Me of the luminances of the pixels in the area (step S14). Next, based on the maximum value Ma, the average value Me, and the like obtained in step S14, the local dimming processing unit obtains (p×q) light emission luminances of the light source (blue LED 63) corresponding to each area (step S15).

Next, the local dimming processing unit obtains (tp×tq) display luminances (t is an integer of 2 or more) based on (p×q) light emission luminances obtained in step S15 (step S16). Next, the local dimming processing unit obtains backlight luminance data including (m×n) display luminances by performing linear interpolation processing on (tp×tq) display luminances (step S17). The backlight luminance data represents the luminances of light incident on (m×n) pixels when all the light sources (blue LEDs 63) emit light with the light emission luminance obtained in step S15. Next, the local dimming processing unit divides the luminances of (m×n) pixels included in the input image by (m×n) display luminances included in the backlight luminance data, respectively, and obtains light transmittance in (m×n) pixels (step S18). Finally, the local dimming processing unit outputs the digital video signal DV corresponding to the data representing the light transmittance obtained in step S18 and the light source control signal BS for causing the light source (blue LED 63) corresponding to each area to emit light with the light emission luminances obtained in step S15 (step S19).

Figure 7:
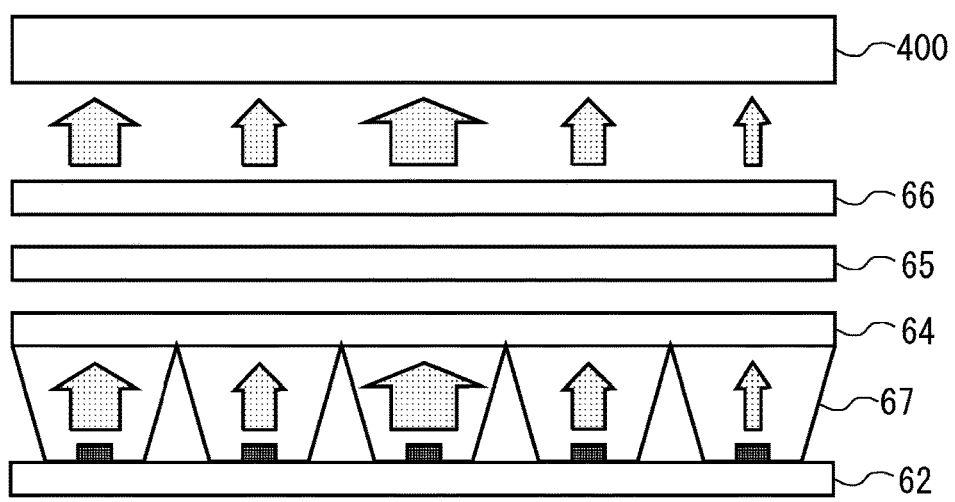
FIG. 7 is a diagram for explaining control of light emission luminance by the local dimming processing in the embodiment.

By performing the local dimming processing as described above, light having a luminance (light emission intensity) which is different for each area is emitted as schematically shown in FIG. 7. In FIG. 7, the luminance of the light (light emission intensity) is represented by the thickness of the arrow.

Figure 8:
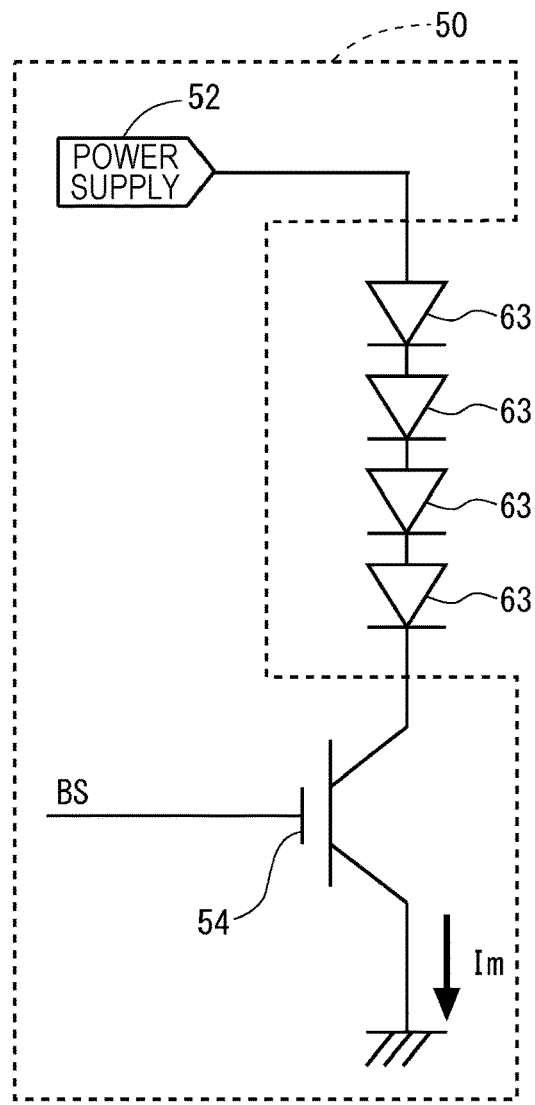
FIG. 8 is a schematic diagram showing a configuration of a unit drive unit for driving blue LEDs included in one LED unit in the embodiment.

FIG. 8 is a schematic diagram showing a configuration of a unit drive unit 50 for driving blue LEDs 63 included in one LED unit. As shown in FIG. 8, the unit drive unit 50 includes a power supply 52 and a current control transistor 54. For the current control transistor 54, the light source control signal BS is applied to the gate terminal, the drain terminal is connected to the blue LED 63, and the source terminal is grounded. Four blue LEDs 63 are connected in series between the power supply 52 and the drain terminal of the current control transistor 54. In such a configuration, the light source control signal BS according to the target luminance (light emission intensity) of the blue LED 63 is applied to the gate terminal of the current control transistor 54. Accordingly, a drive current Im corresponding to the target luminance of the blue LED 63 flows.

4. Reflection Partition

Figure 9:
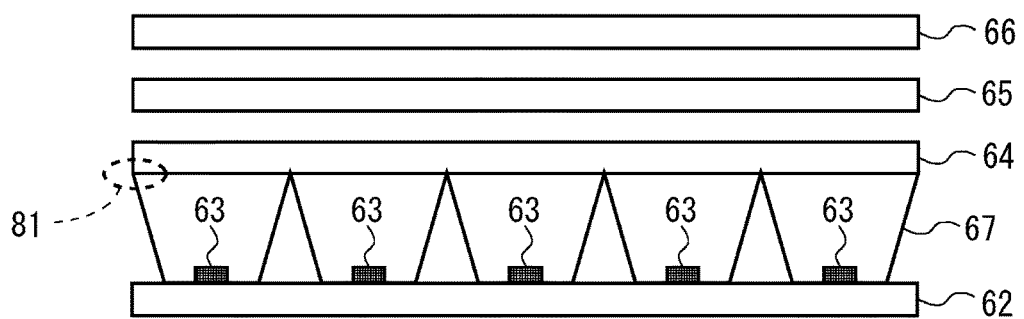
FIG. 9 is a diagram for explaining a reflection partition in the embodiment.

FIG. 9 is a diagram for explaining the reflection partition 67 in the present embodiment. As described above, in the present embodiment, one organized LED unit is formed by four blue LEDs 63, and such an LED unit is provided for each area. The reflection partition 67 is provided so as to correspond to each area. More specifically, the reflection partition 67 is provided so as to surround each LED unit on the LED substrate 62. That is, each reflection partition 67 is provided so as to surround four blue LEDs 63.

A surface of the reflection partition 67 is formed of a reflection material. The height and the angle of the reflection partition 67 are designed so that the light emitted from the blue LED 63 corresponding to each area does not reach other areas. In the present embodiment, an upper end portion of the reflection partition 67 is in contact with the diffuser plate 64 as a portion denoted by reference numeral 81 in FIG. 9. That is, space inside the reflection partition 67 of each area is closed space.

According to the present embodiment, since the reflection partition 67 is provided so as to surround the LED unit, the light emitted from the blue LED 63 in each area does not reach other areas. In other words, unlike the case in the related art, each area is not irradiated with the light of the reflection component of the light emitted from other areas. In consideration of this point, the content (phosphor concentration) of the phosphor in the phosphor sheet 65 is adjusted.

Figure 10:
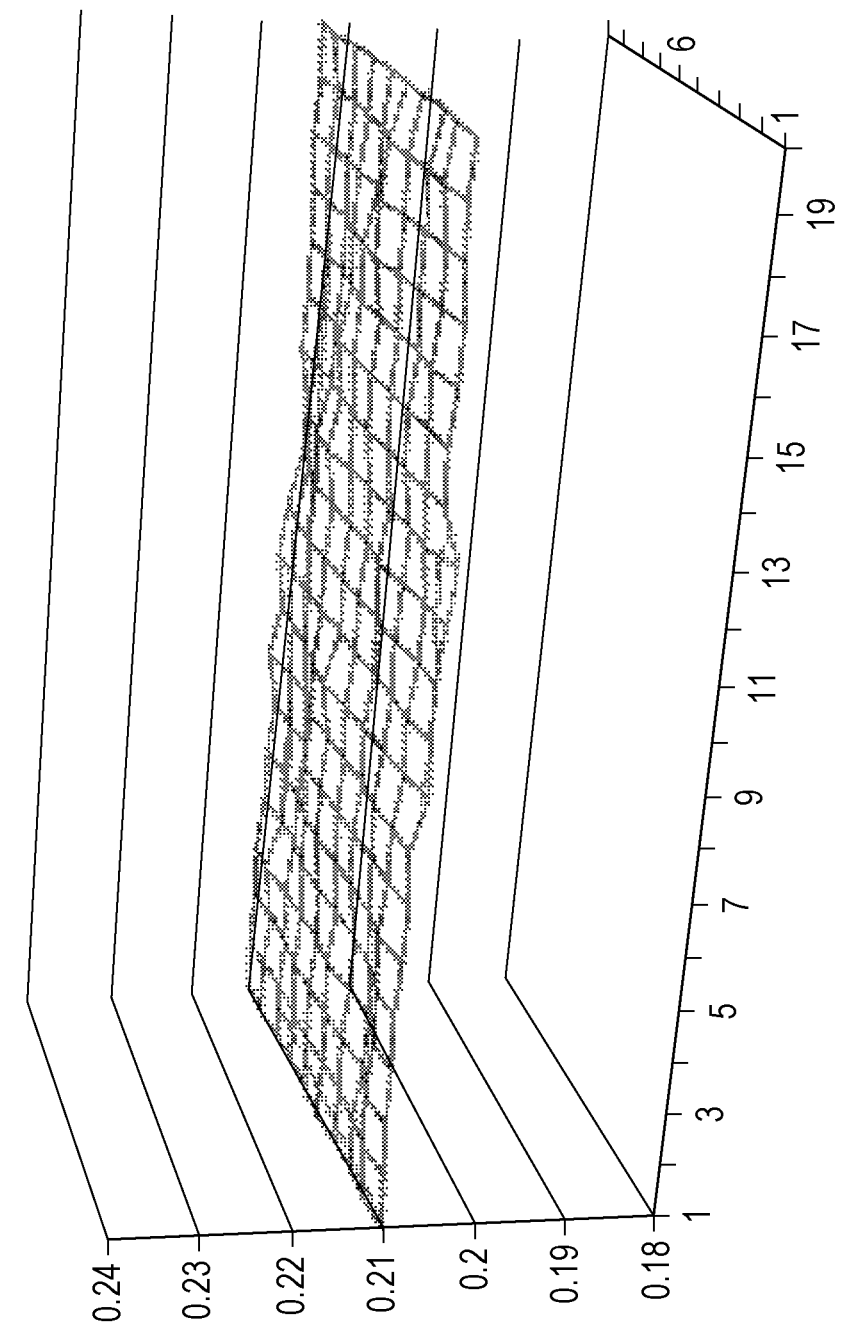
FIG. 10 is a diagram showing chromaticity x when full lighting is performed in the embodiment.
Figure 11:
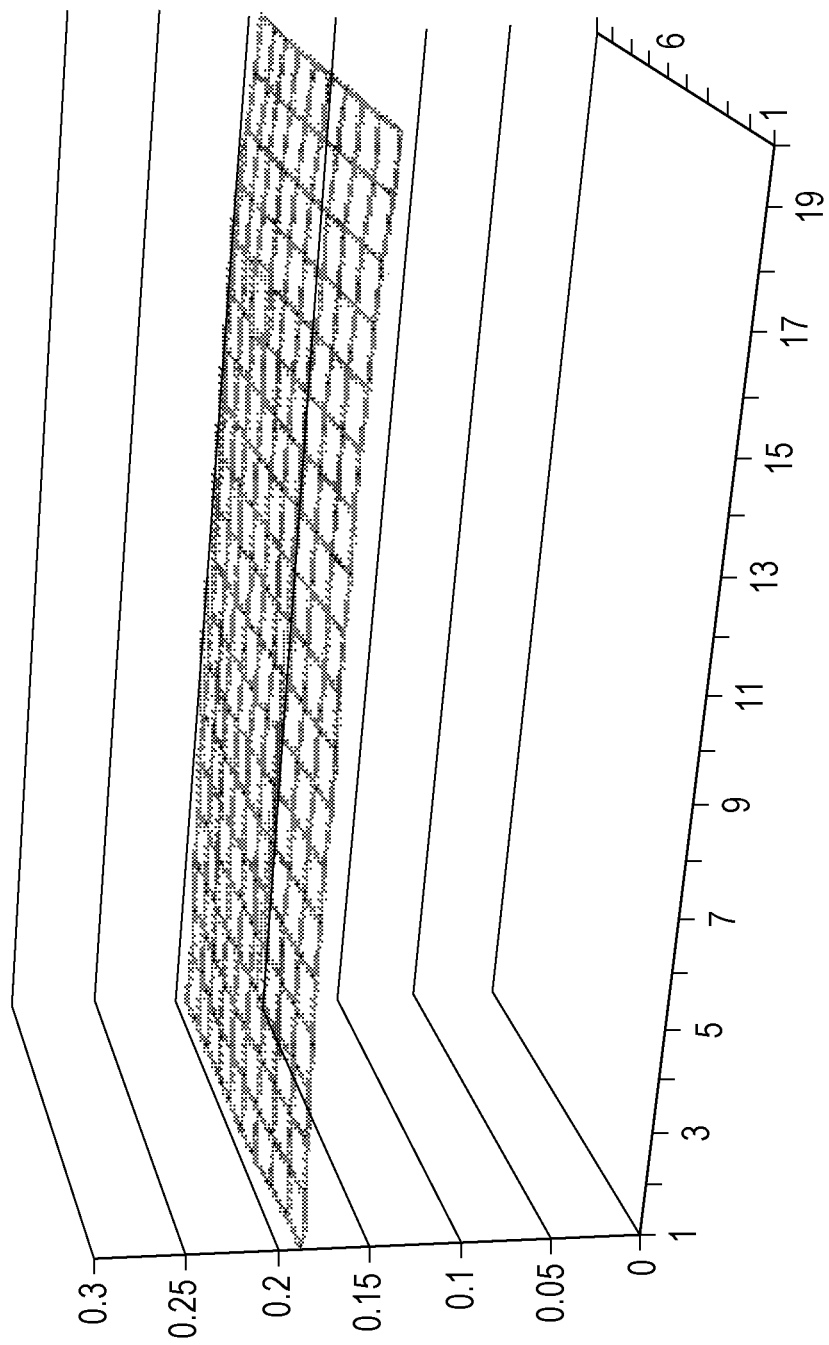
FIG. 11 is a diagram showing chromaticity y when full lighting is performed in the embodiment.
Figure 30:
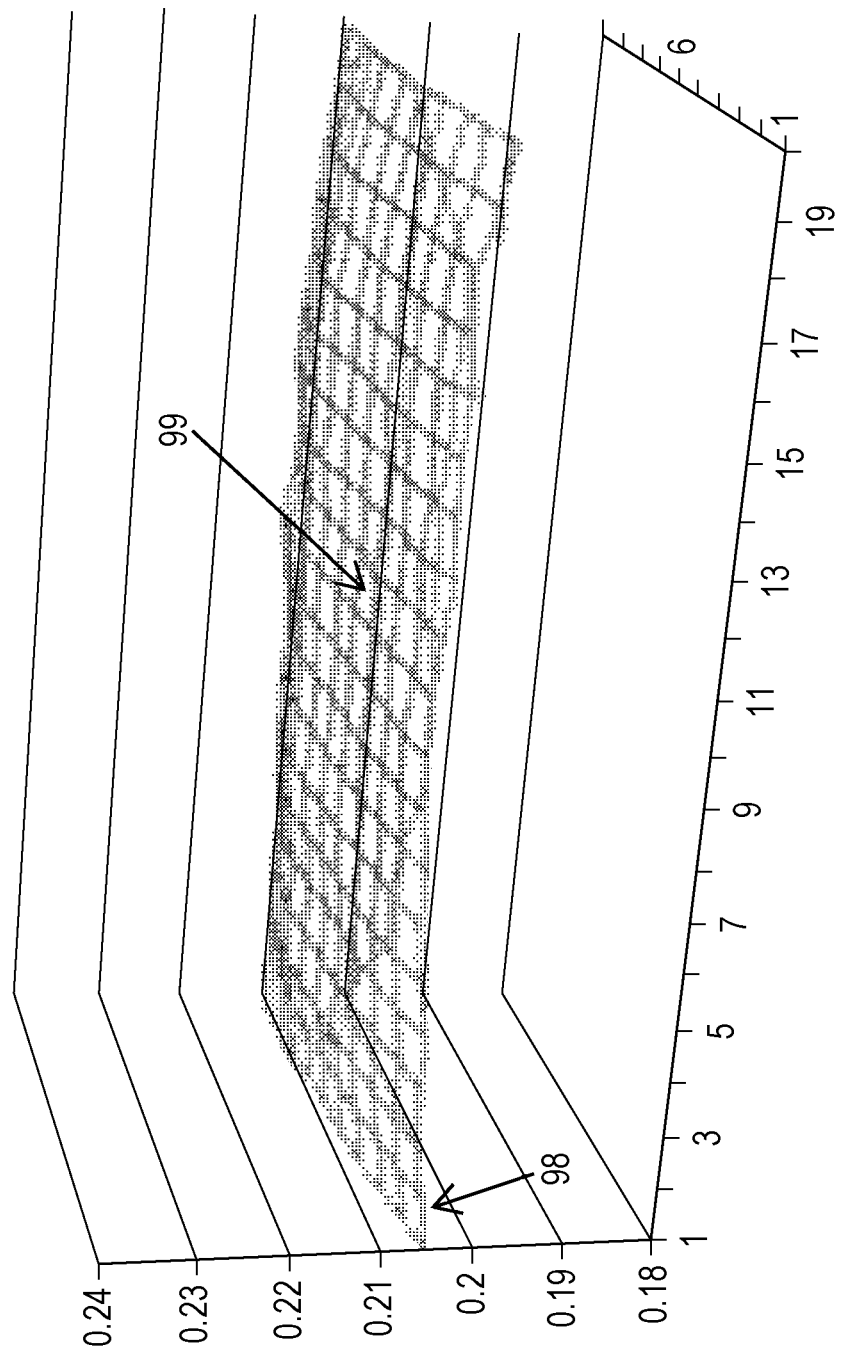
FIG. 30 is a diagram showing the chromaticity x when full lighting is performed in the configuration using the phosphor sheet in the related art.
Figure 31:
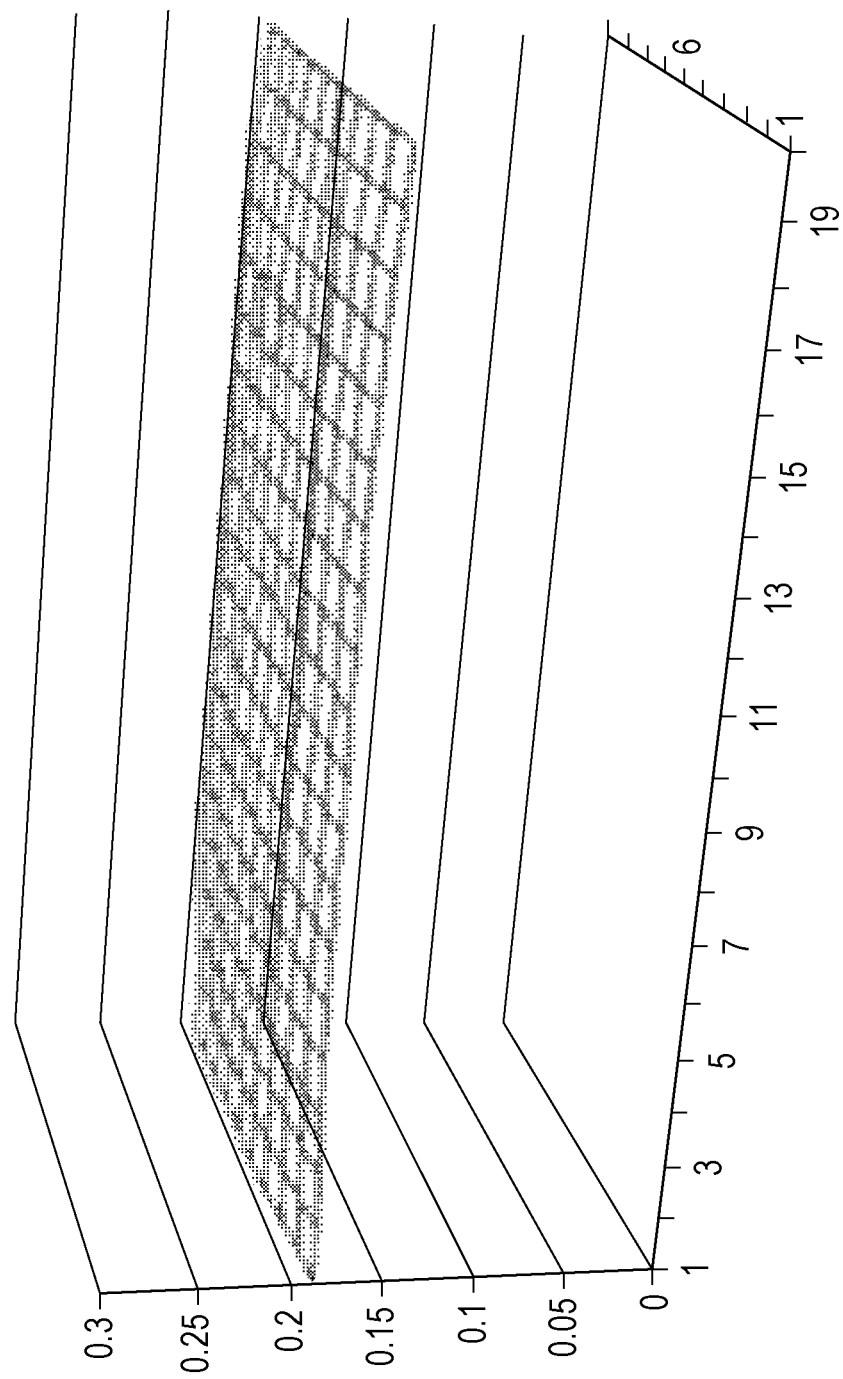
FIG. 31 is a diagram showing the chromaticity y when full lighting is performed in the configuration using the phosphor sheet in the related art.

By providing the above-described reflection partition 67, the chromaticity x and chromaticity y when the full lighting is performed are as shown in FIGS. 10 and 11, respectively. As can be seen from FIGS. 10 and 11, unlike the case in the related art (see FIGS. 30 and 31), the values of the chromaticity x and chromaticity y are substantially uniform on the entire screen.

Figure 32:
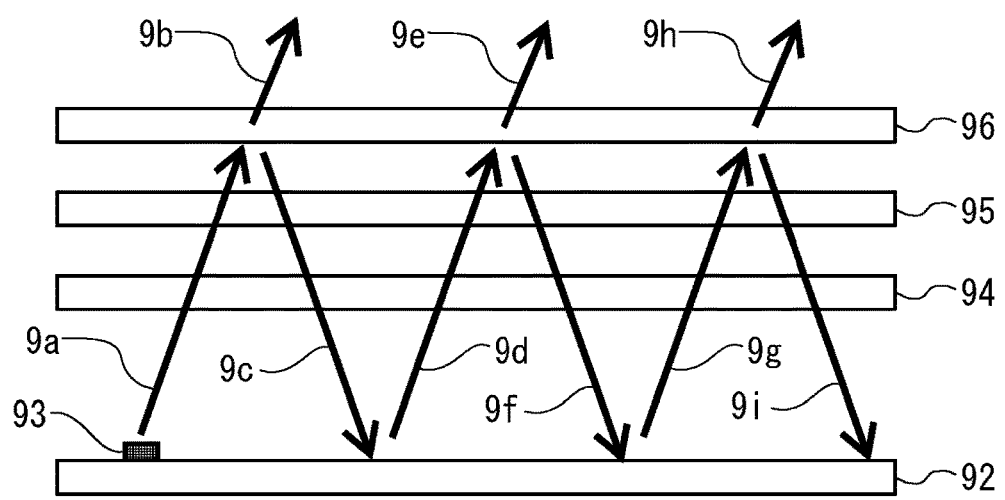
FIG. 32 is a diagram for explaining a cause of occurrence of coloration in the configuration using the phosphor sheet in the related art.

In the liquid crystal display apparatus according to the present embodiment, the local dimming processing is performed. Therefore, only the light sources (blue LED 63) in some areas may be lighted up (hereinafter, referred to as "partial lighting"). In this regard, since a portion of light emitted from the light source in a certain area reaches other areas by repeating the reflection (see FIG. 32), the chromaticity of the backlight light may be different depending on locations when the partial lighting is performed in the configuration using the phosphor sheet in the related art. This will be described below.

Figure 12:
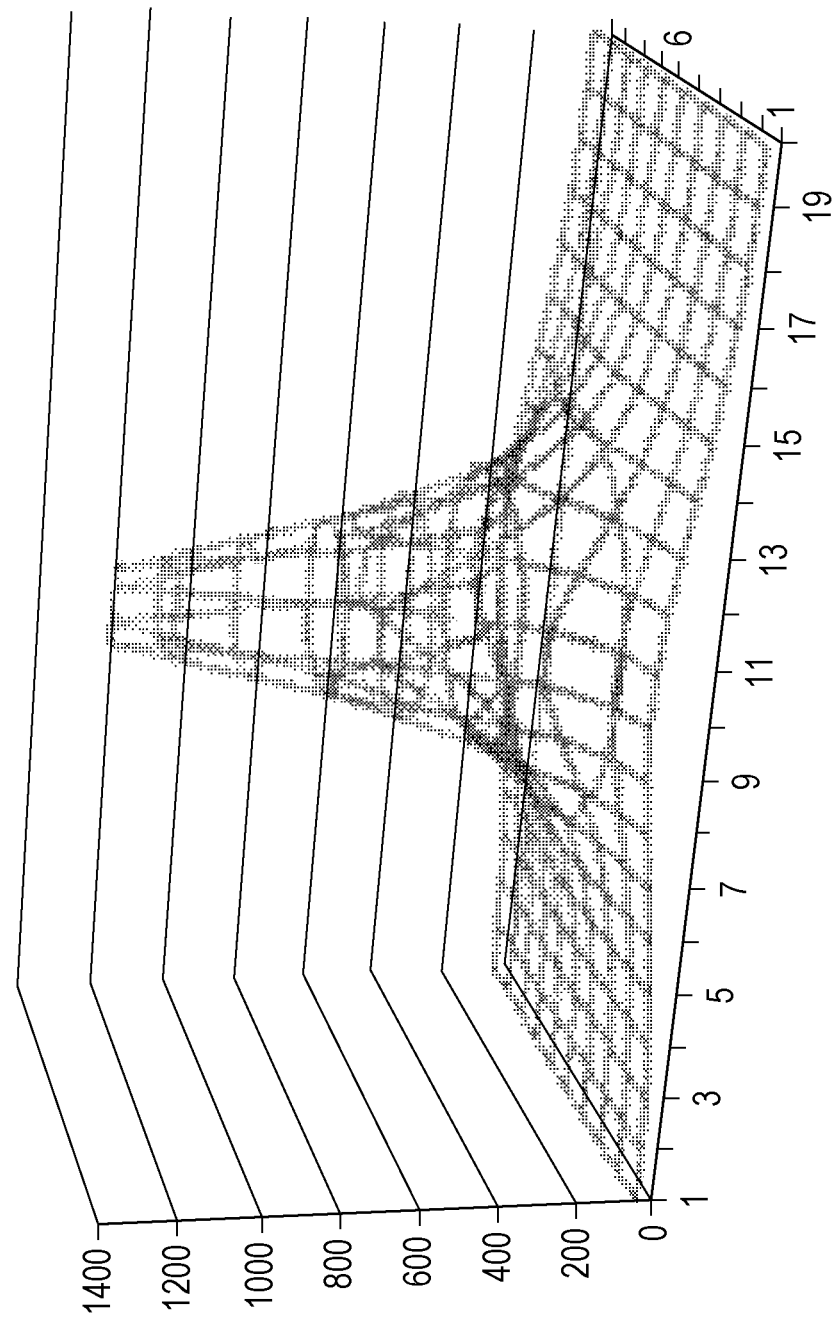
FIG. 12 is a diagram showing luminance when lighting is performed at only one central area in a configuration using a white LED.
Figure 13:
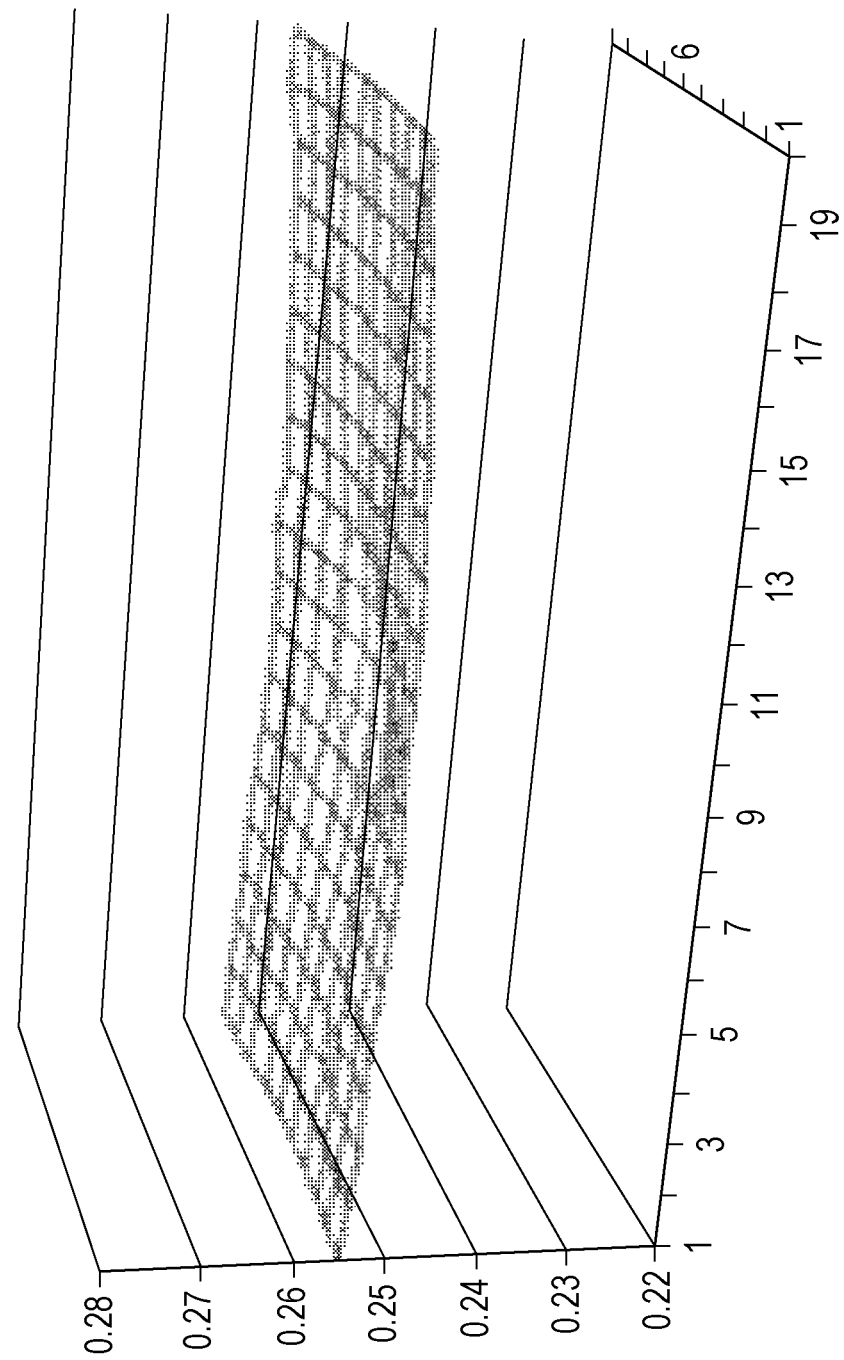
FIG. 13 is a diagram showing the chromaticity x when lighting is performed at only one central area in the configuration using the white LED.
Figure 14:
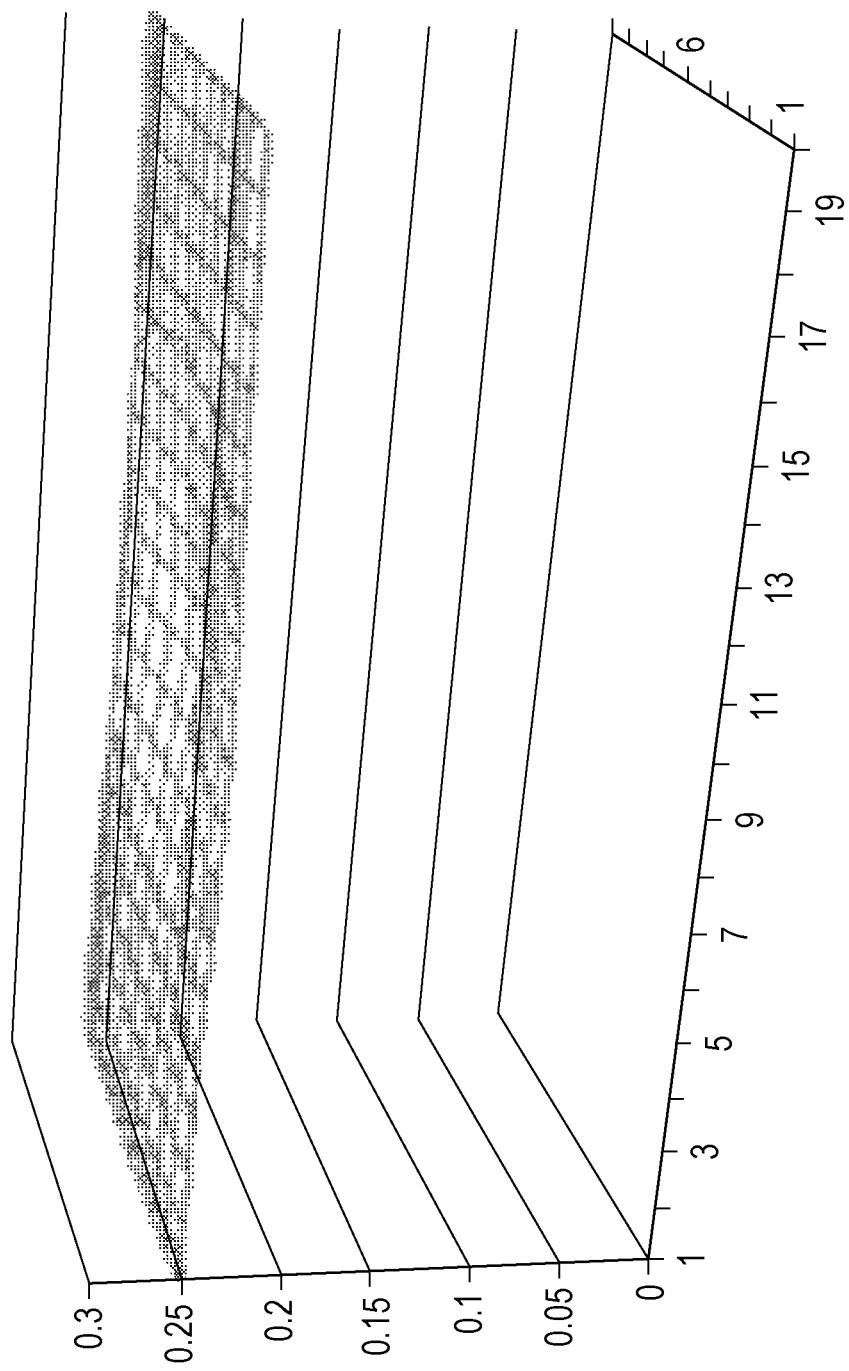
FIG. 14 is a diagram showing the chromaticity y when lighting is performed at only one central area in the configuration using the white LED.
Figure 15:
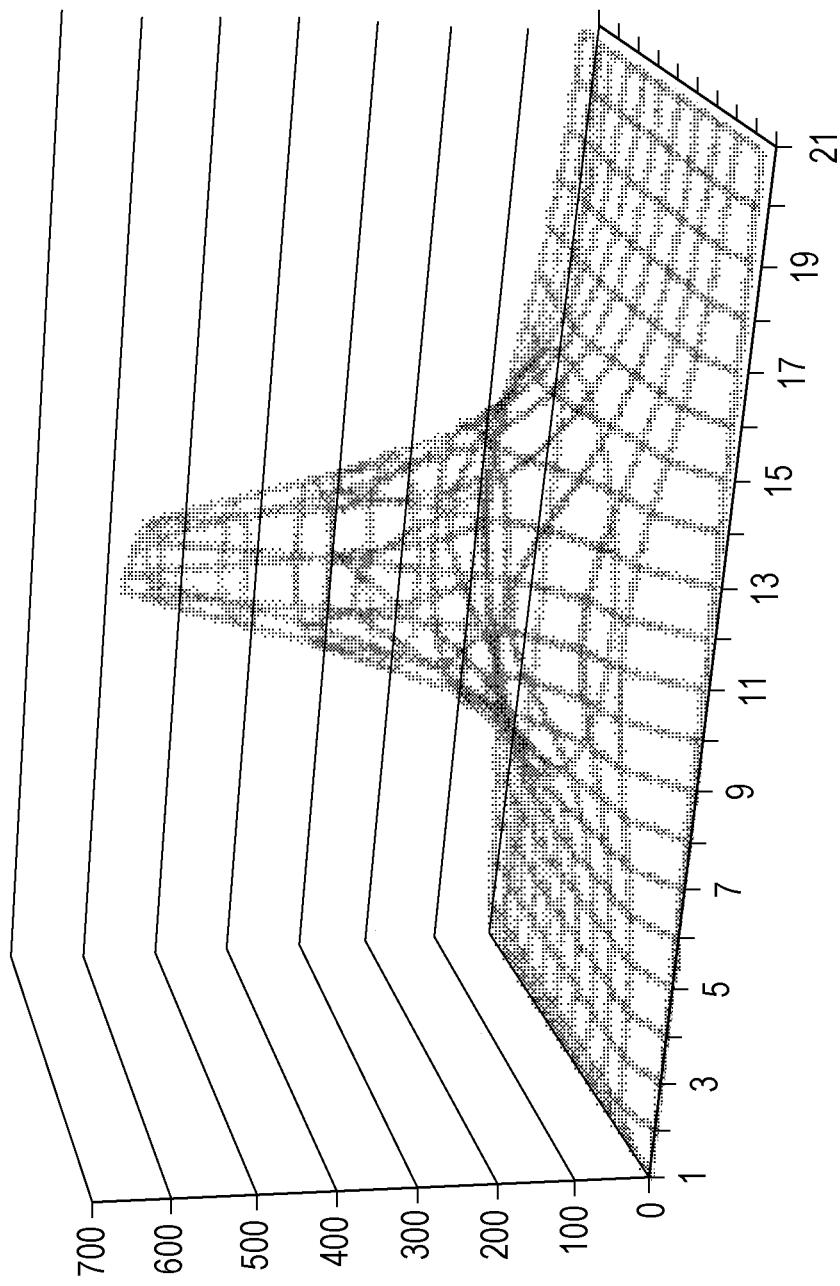
FIG. 15 is a diagram showing the luminance when lighting is performed at only one central area in a configuration using a phosphor sheet in the related art.
Figure 16:
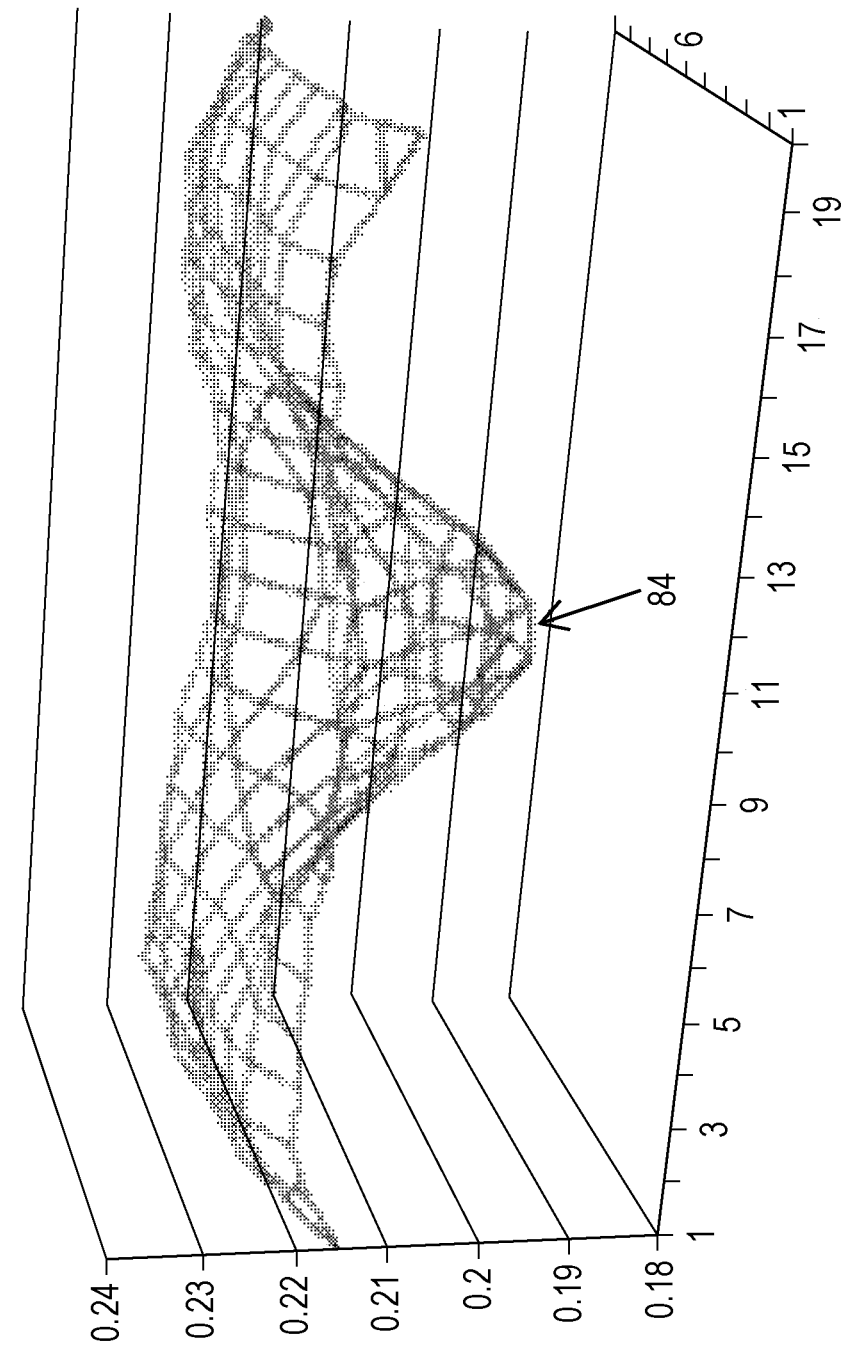
FIG. 16 is a diagram showing the chromaticity x when lighting is performed at only one central area in the configuration using the phosphor sheet in the related art.
Figure 17:
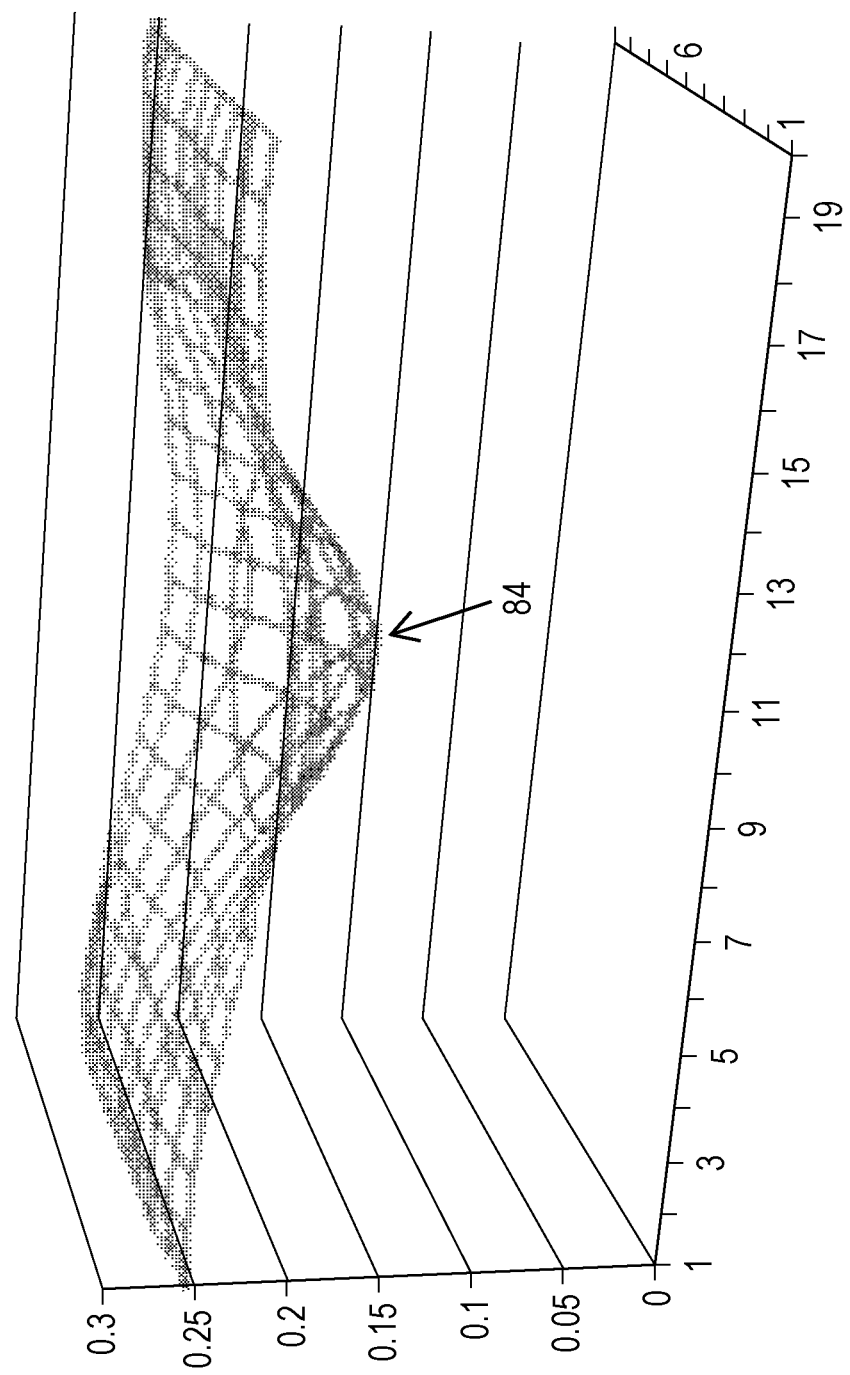
FIG. 17 is a diagram showing the chromaticity y when lighting is performed at only one central area in the configuration using the phosphor sheet in the related art.

FIGS. 12 to 14 are diagrams respectively showing the luminance, the chromaticity x, and the chromaticity y when lighting (partial lighting) is performed at only one central area in the configuration using the white LED. FIGS. 15 to 17 are diagrams respectively showing the luminance, the chromaticity x, and the chromaticity y when lighting (partial lighting) is performed at only one central area in the configuration using the phosphor sheet in the related art. From FIGS. 12 to 17, it is understood that the difference in the chromaticity depending on locations in the configuration using the phosphor sheet in the related art is larger than the difference in the chromaticity depending on locations in the configuration using the white LED. As can be seen from FIGS. 16 and 17, in the configuration using the phosphor sheet in the related art, the color of the backlight light has a blue tinge in the vicinity directly above the blue LED which is lighted up (portion denoted by arrow 84 in FIGS. 16 and 17), and the color of the backlight light has a yellower tinge as the distance from the lighting portion increases. As described above, when the partial lighting is performed in the configuration using the phosphor sheet in the related art, color unevenness occurs due to the small amount of light mixed in each area.

Figure 18:
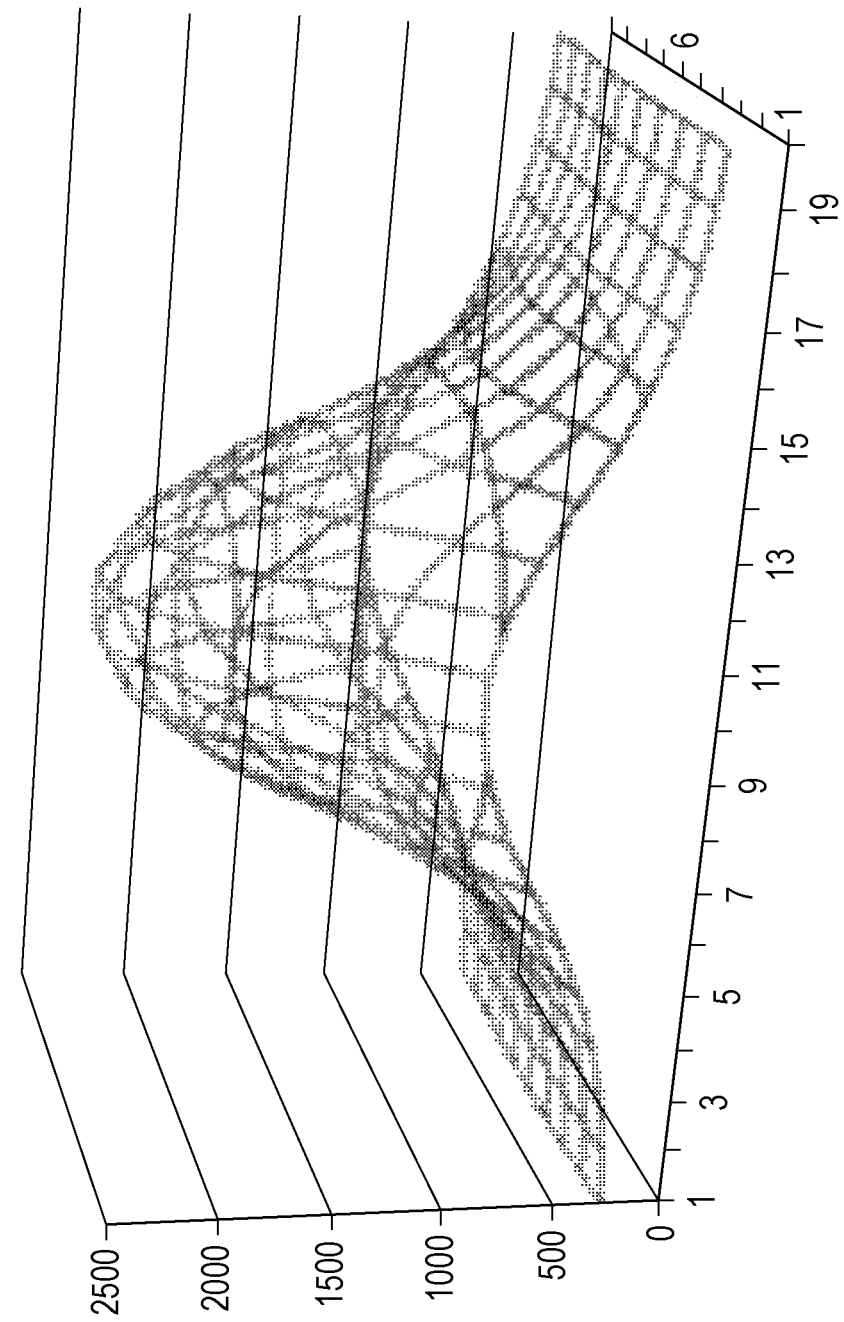
FIG. 18 is a diagram showing the luminance when lighting of 36 areas (vertical 6 areas×horizontal 6 areas) is performed in the configuration using the phosphor sheet in the related art.
Figure 19:
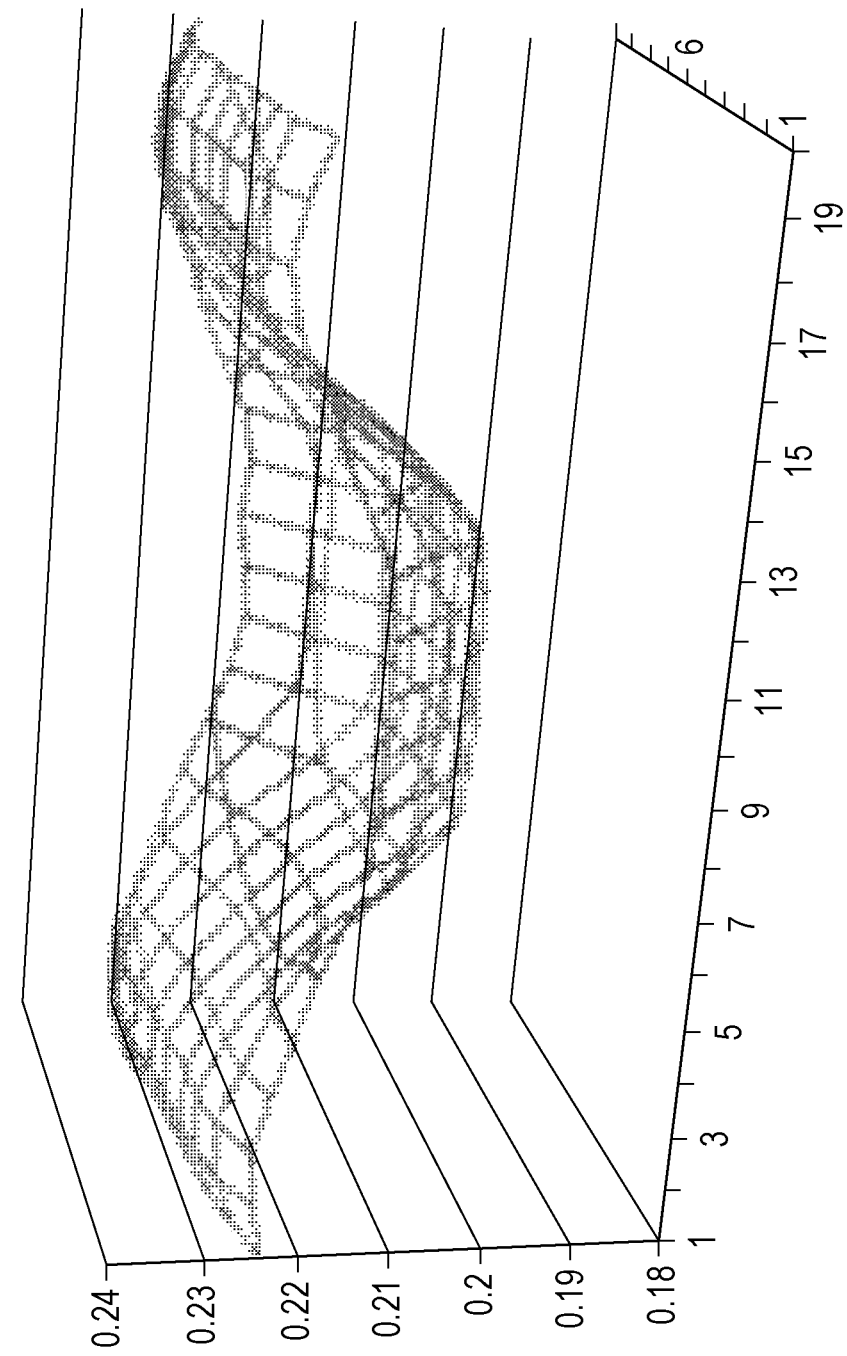
FIG. 19 is a diagram showing the chromaticity x when the lighting of 36 areas (vertical 6 areas×horizontal 6 areas) is performed in the configuration using the phosphor sheet in the related art.
Figure 20:
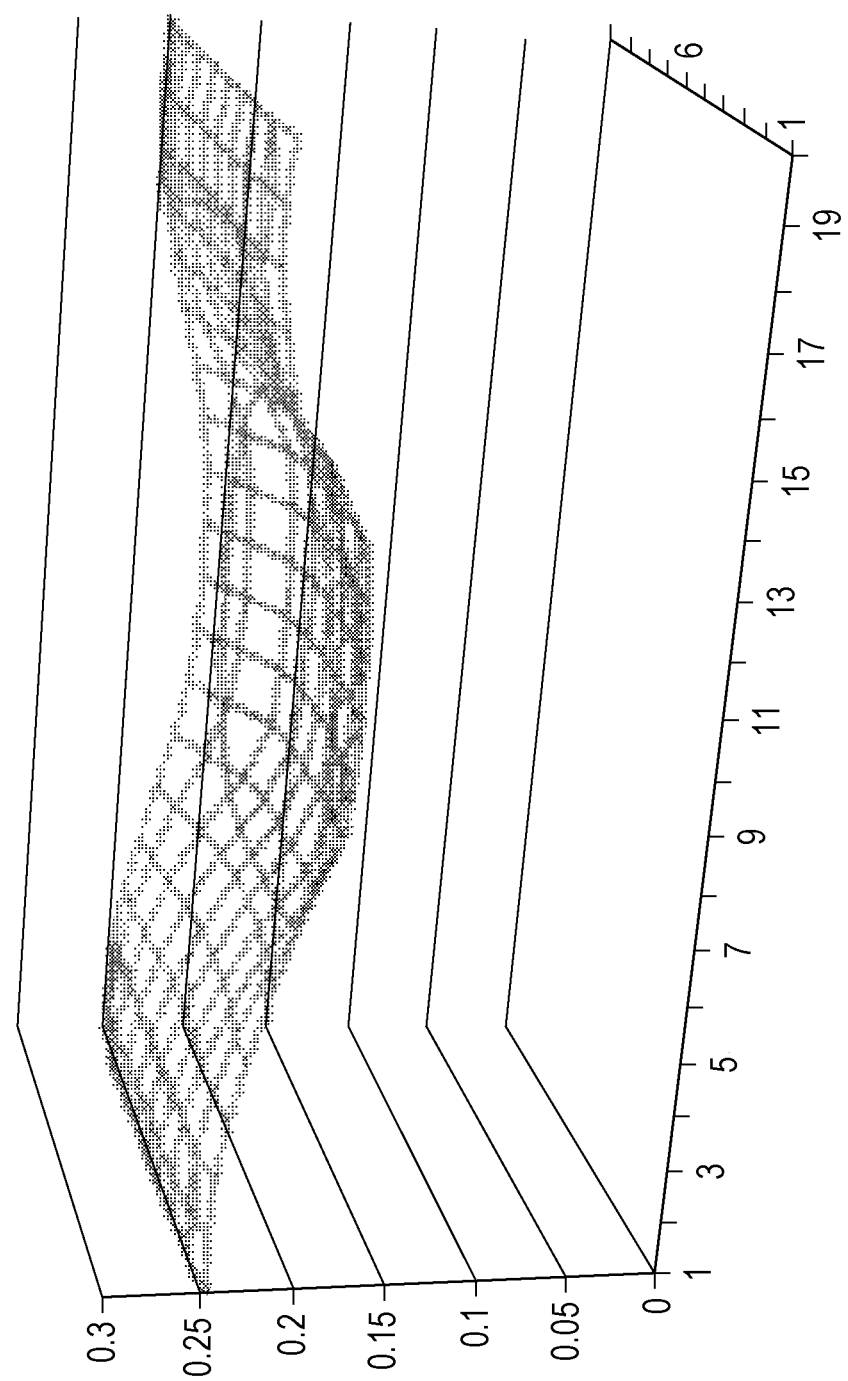
FIG. 20 is a diagram showing the chromaticity y when the lighting of 36 areas (vertical 6 areas×horizontal 6 areas) is performed in the configuration using the phosphor sheet in the related art.

FIGS. 18 to 20 are diagrams respectively showing the luminance, the chromaticity x, and the chromaticity y when the lighting (partial lighting) of 36 areas (vertical 6 areas× horizontal 6 areas) is performed in the configuration using the phosphor sheet in the related art. From FIGS. 16, 17, 19, and 20, it is understood that the chromaticity of the backlight light in the vicinity of directly above the blue LED which is lighted up differs depending on the range in which partial lighting is performed. That is, the way in which color unevenness occurs differs depending on the range in which the partial lighting is performed.

Figure 21:
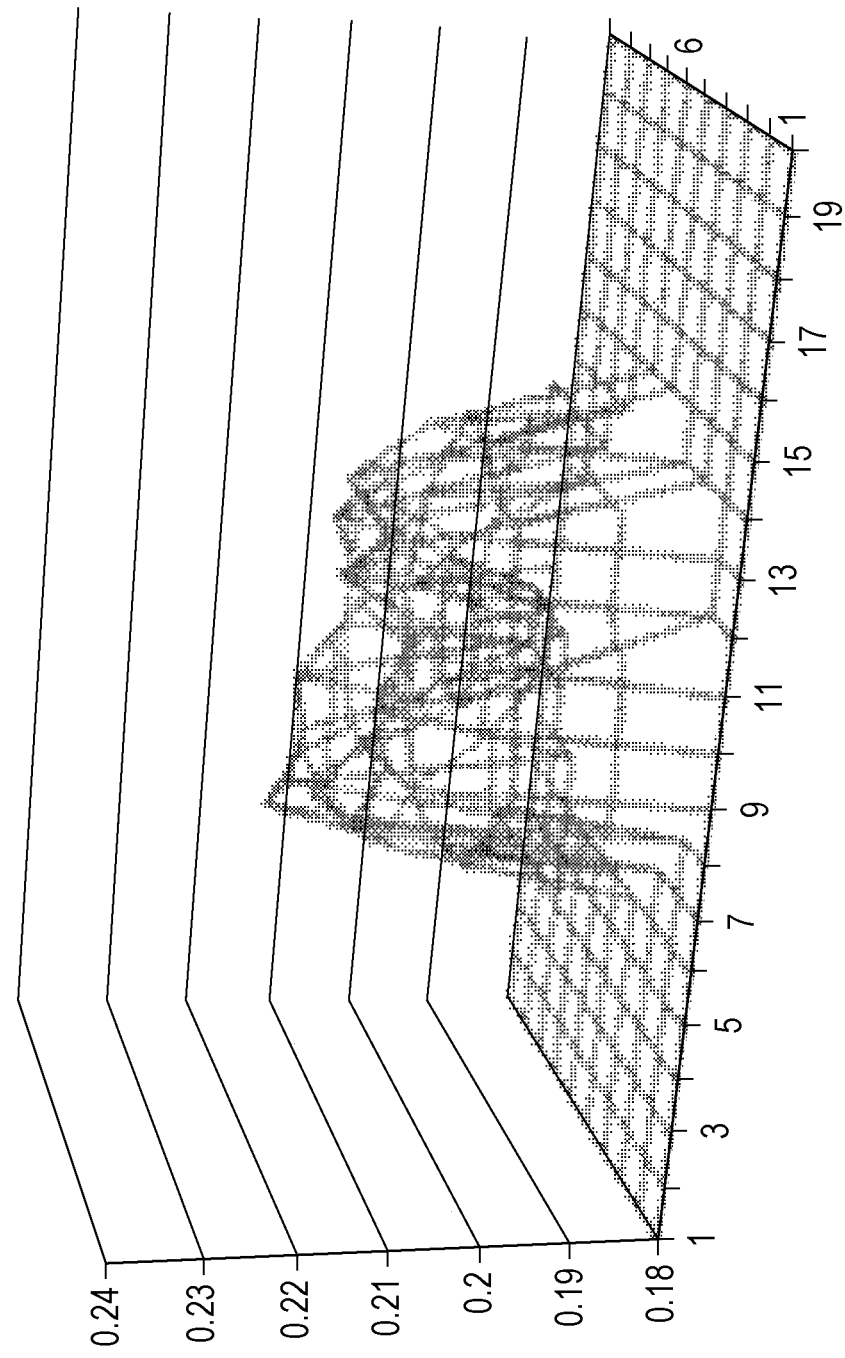
FIG. 21 is a diagram showing the chromaticity x when lighting is performed at only one central area in the embodiment.
Figure 22:
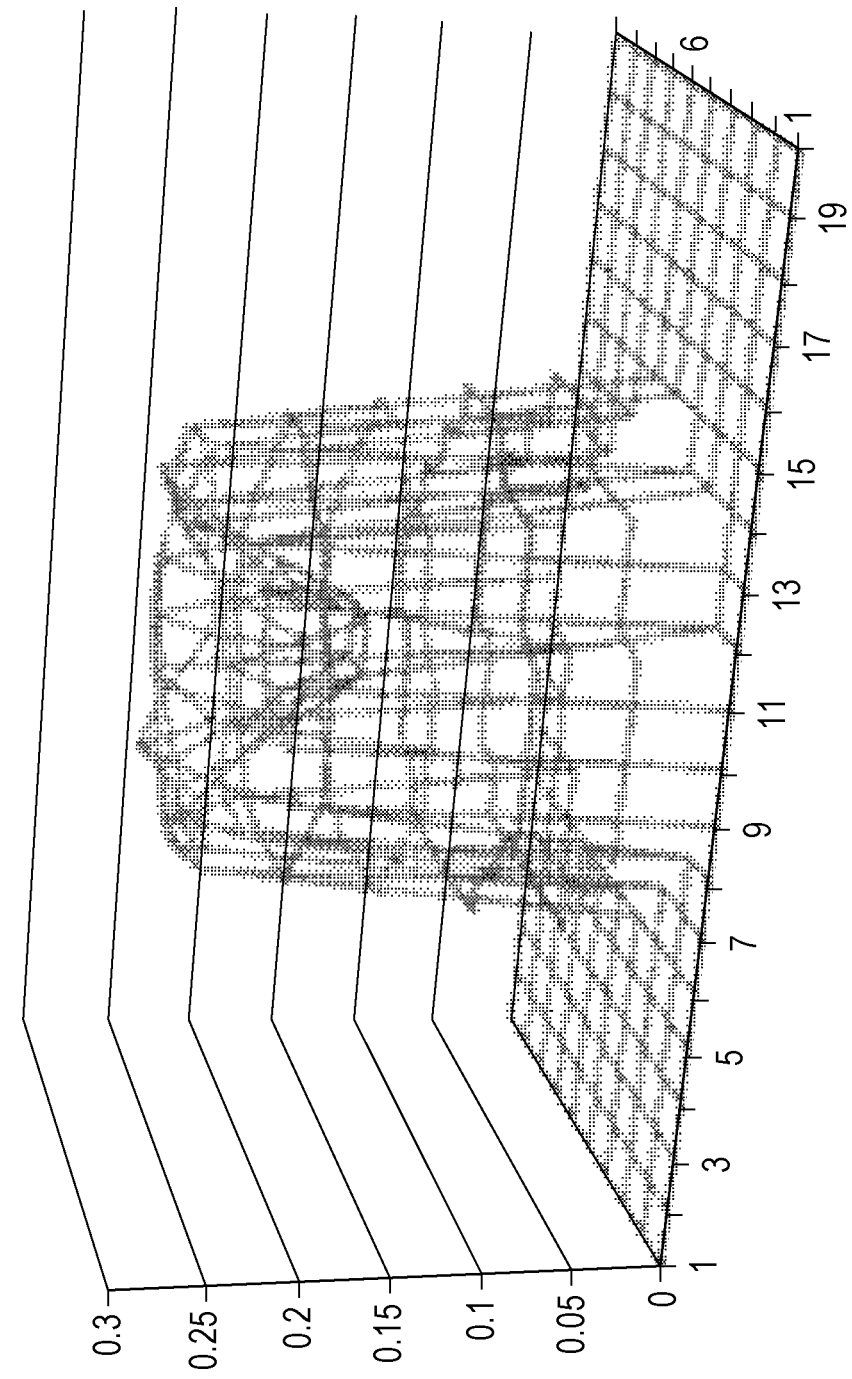
FIG. 22 is a diagram showing the chromaticity y when lighting is performed at only one central area in the embodiment.

As described above, in the configuration using the phosphor sheet in the related art, color unevenness occurs when partial lighting is performed. On the other hand, according to the present embodiment, the chromaticity x and the chromaticity y when, for example, the lighting (partial lighting) of only one central area is performed are as shown in FIGS. 21 and 22. As can be seen from FIGS. 21 and 22, the light emitted from the blue LED is not leaked from the lighting area to another area, and relatively uniform chromaticity distribution is obtained. According to the present embodiment, the occurrence of the color unevenness when the partial lighting is performed is suppressed.

5. Effect

According to the present embodiment, the reflection partition 67 in which the surface thereof is formed of a reflection material is provided is provided so as to surround the LED unit (four blue LEDs 63) in each area in the backlight device 600 having the configuration combining the blue LED 63 and the phosphor sheet 65. Therefore, it is possible to suppress the light emitted from the blue LED 63 in each area from reaching other areas. In other words, the light emitted from the blue LED 63 in other areas hardly reaches each area. Therefore, the entire screen is irradiated with backlight light having uniform chromaticity. That is, unlike the case in the related art, the screen end portion is irradiated with light having the same chromaticity with the chromaticity of light applied to other regions. Accordingly, the occurrence of the coloration at the screen end portion is suppressed. As described above, the occurrence of the coloration at the screen end portion is suppressed in the liquid crystal display apparatus adopting the backlight device 600 having a configuration combining the blue LED 63 and the phosphor sheet 65.

When the partial lighting is performed, the leakage of light from the lighting area to non-lighting area is suppressed. Therefore, the lighting area is irradiated with backlight light having substantially uniform chromaticity regardless of the size of the lighting area. Accordingly, the occurrence of color unevenness when the partial lighting is performed can be suppressed.

Furthermore, in the liquid crystal display apparatus according to the present embodiment, the local dimming processing is performed. That is, the light emission intensity of the blue LED 63 is controlled for each area. Therefore, low power consumption can be achieved. In addition, it is possible to expand the dynamic range by causing the blue LED 63 to emit light intensively at a high gray scale portion with high light emission intensity.

6. Modification Examples

Hereinafter, modification examples of the embodiment will be described.

6.1 First Modification Example

Figure 23:
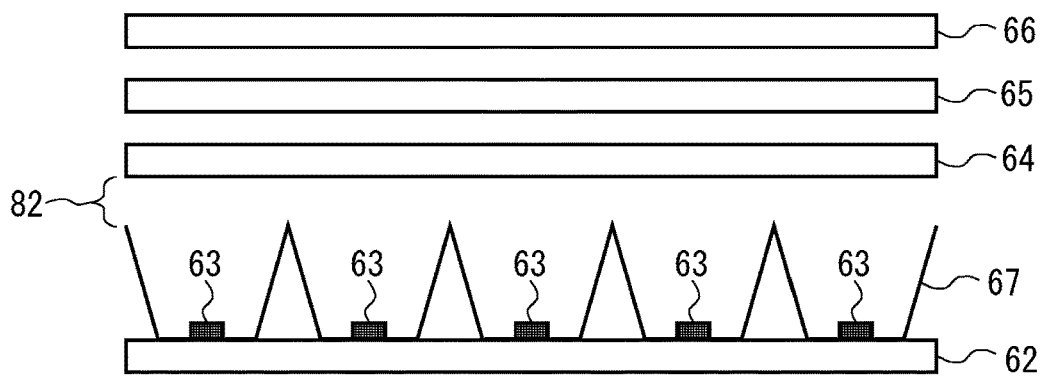
FIG. 23 is a diagram for explaining a reflection partition in a first modification example of the embodiment.

FIG. 23 is a diagram for explaining a reflection partition 67 in a first modification example of the embodiment. In the embodiment, the upper end portion of the reflection partition 67 is in contact with the diffuser plate 64, and space inside the reflection partition 67 of each area is closed space (see FIG. 9). In such a configuration, there is a concern that a boundary portion (portion forming ridgeline) of the reflection partition 67 becomes a dark line and unevenness in luminance occurs. In the present modification example, a certain distance (interval) is provided between the upper end portion of the reflection partition 67 and the diffuser plate 64 as a portion denoted by reference numeral 82 in FIG. 23. Accordingly, the occurrence of the dark line is suppressed. As a result, the occurrence of unevenness in luminance caused by providing the reflection partition 67 is suppressed.

6.2 Second Modification Example

Figure 24:
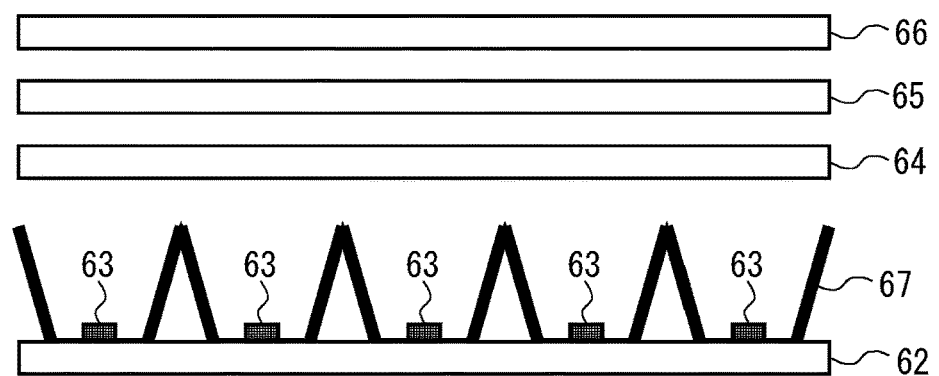
FIG. 24 is a diagram for explaining a reflection partition in a second modification example of the embodiment.
Figure 25:
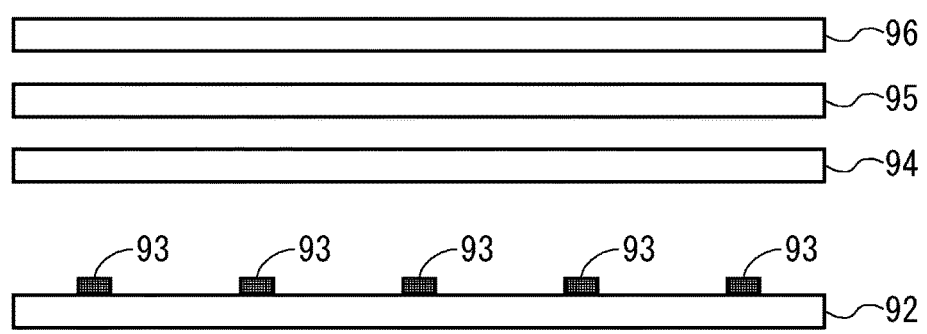
FIG. 25 is a side view showing a schematic configuration of a backlight device that obtains white light by a combination of a blue LED and a wavelength conversion sheet in the related art.
Figure 26:
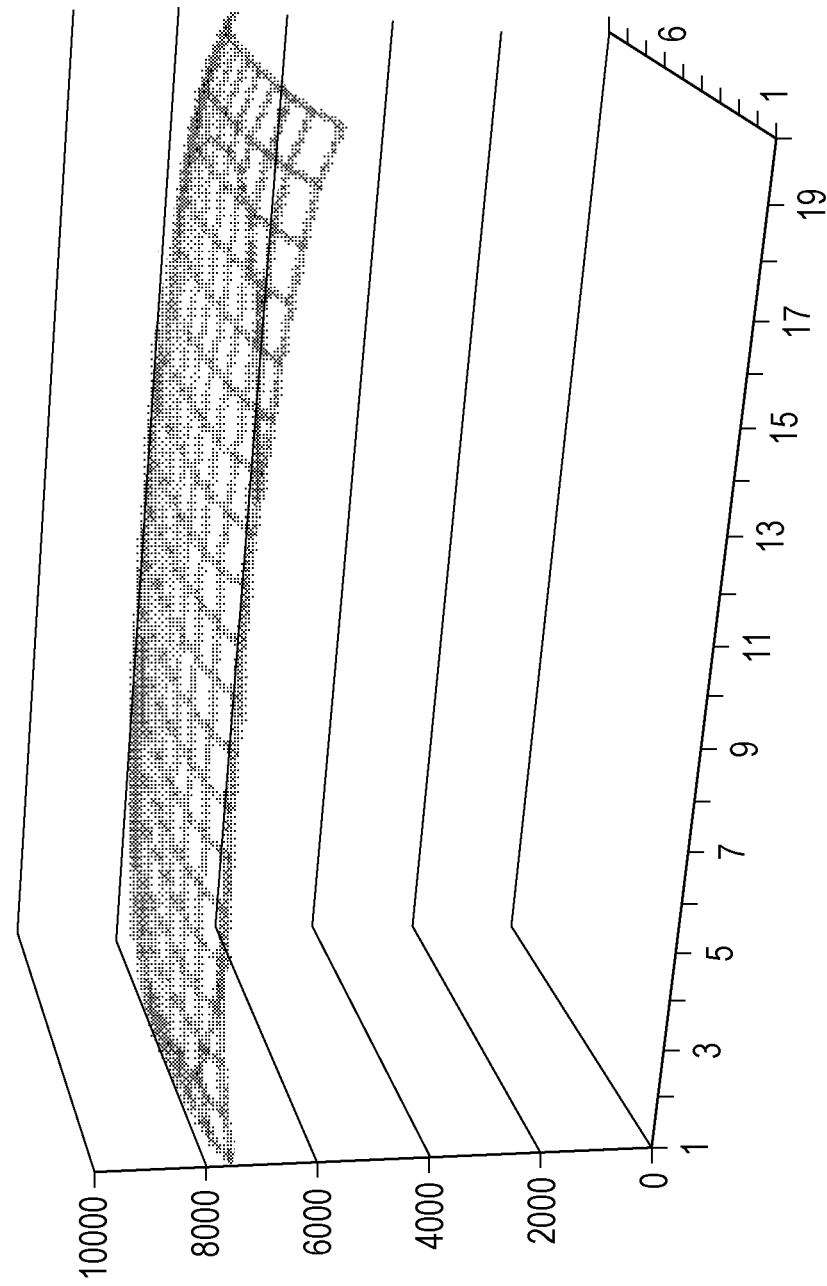
FIG. 26 is a diagram showing the luminance when full lighting is performed in the configuration using the white LED.
Figure 27:
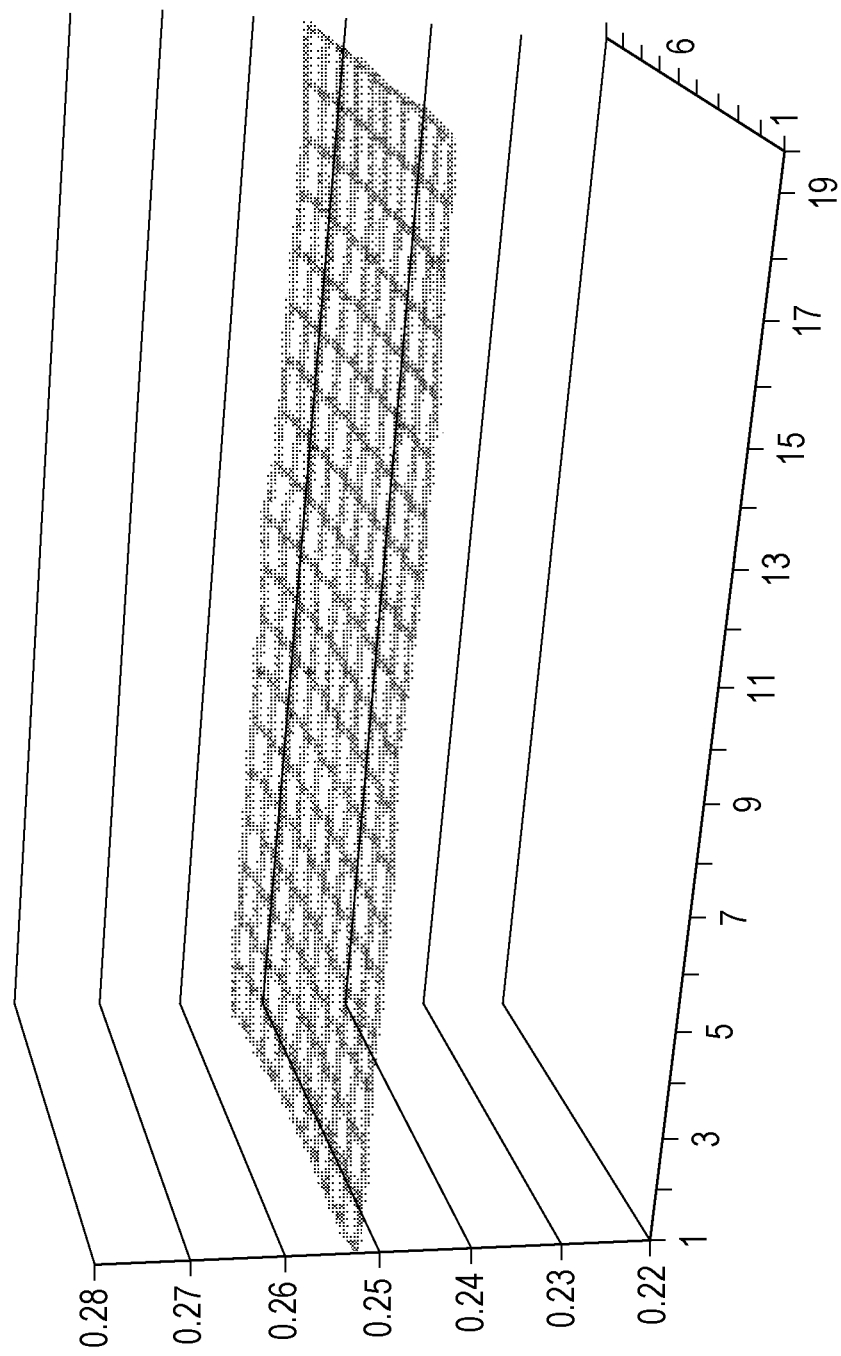
FIG. 27 is a diagram showing the chromaticity x when full lighting is performed in the configuration using the white LED.
Figure 28:
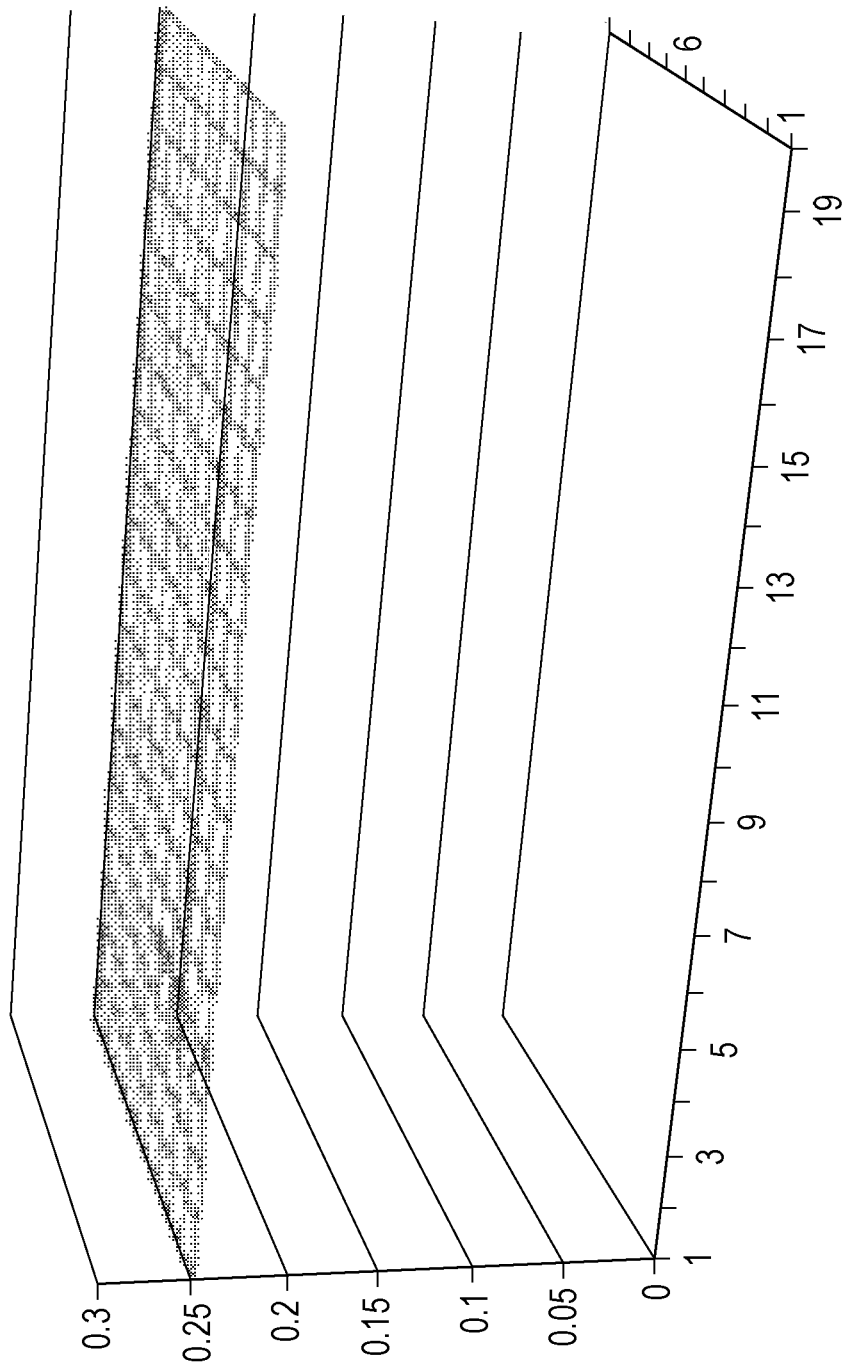
FIG. 28 is a diagram showing the chromaticity y when full lighting is performed in the configuration using the white LED.
Figure 29:
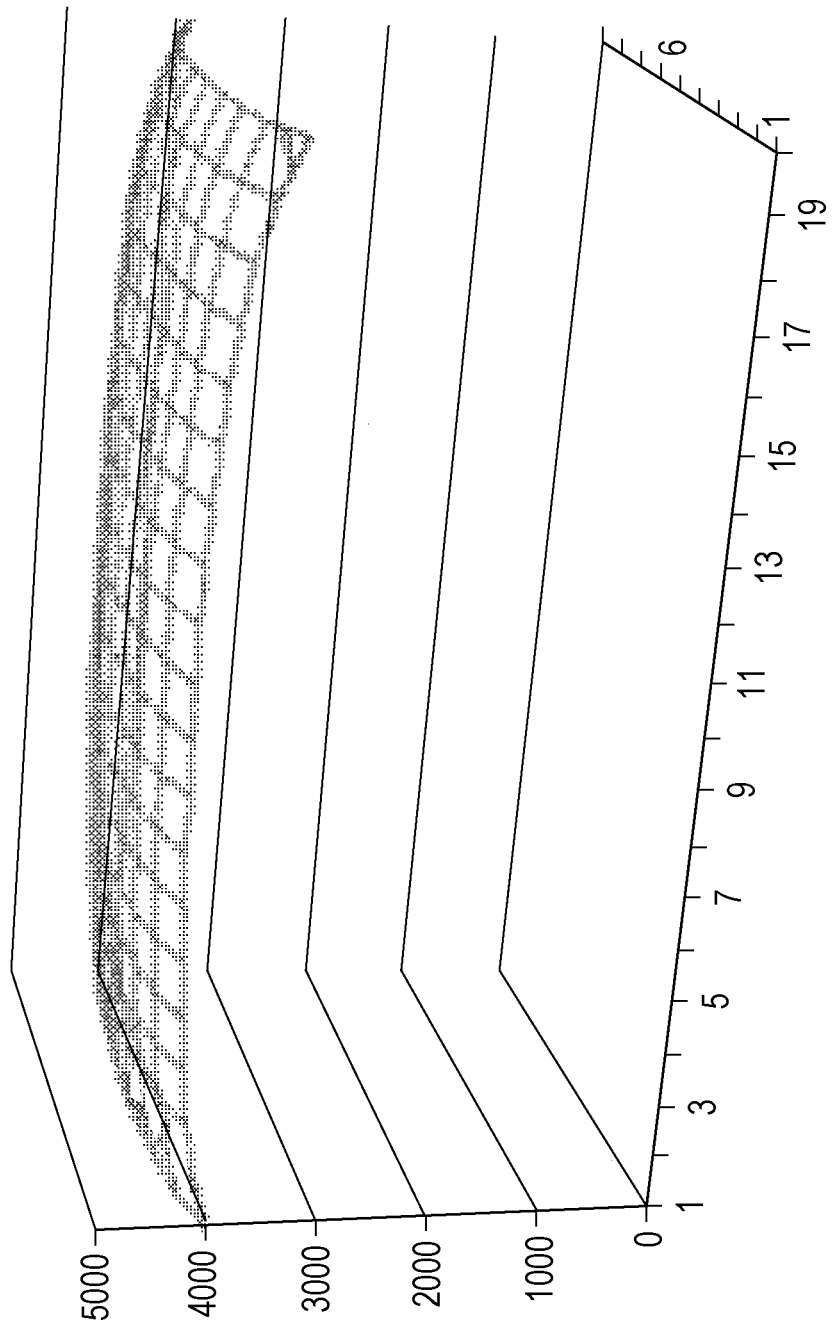
FIG. 29 is a diagram showing the luminance when full lighting is performed in the configuration using the phosphor sheet in the related art.

FIG. 24 is a diagram for explaining a reflection partition 67 in a second modification example of the embodiment. In the first modification example, the configuration in which a certain distance is provided between the upper end portion of the reflection partition 67 and the diffuser plate 64 is adopted in order to suppress the occurrence of unevenness in luminance caused by the boundary portion of the reflection partition 67 becoming a dark line. However, in such a configuration, since space is generated between the upper end portion of the reflection partition 67 and the diffuser plate 64, the leakage of the light from each area to another area may occur. Therefore, there is a concern about the occurrence of color unevenness caused by the leakage of light. In the present modification example, the color of the surface of the reflection partition 67 is blue. In FIG. 24, the reflection partition 67 of which the color of the surface is blue is represented by a bold line.

According to such a configuration, regarding the light incident on the reflection partition 67 among the reflected light from the optical sheet 66, only a blue component is reflected by the reflection partition 67. Therefore, the leakage of light including a yellow component from each area to another areas is suppressed. Therefore, even though a certain distance is provided between the upper end portion of the reflection partition 67 and the diffuser plate 64, the occurrence of color unevenness caused by the leakage of light from each area to another areas is suppressed.

7. Others

In the embodiment (including modification examples), the phosphor sheet 65 is used as a wavelength conversion sheet for obtaining white light from blue light, but the present disclosure is not limited thereto. A quantum dot sheet can also be used in place of the phosphor sheet 65. For example, it is also possible to use a quantum dot sheet including a green quantum dot having an emission peak wavelength of 500 to 550 nm and a red quantum dot having an emission peak wavelength of 600 nm or more. By using such a quantum dot sheet, the half value width of the green light and the red light can be narrowed. Therefore, by combining a backlight device having such a configuration using a quantum dot sheet and a liquid crystal panel having a configuration using a high-density color filter, widening of the color gamut of the liquid crystal display apparatus is realized.

In the embodiment, the local dimming processing is performed, but the present disclosure is not limited thereto. The present disclosure can also be applied to a liquid crystal display apparatus not subjected to the local dimming processing.

In the embodiment, one LED unit includes four blue LEDs 63, but the present disclosure is not limited thereto. For example, one LED unit may include one blue LED 63. That is, only one blue LED 63 may be provided for each area. The arrangement state of the blue LEDs 63 on the LED substrate 62 is not limited to the one shown in FIG. 5.

Furthermore, in the embodiment, a liquid crystal display apparatus has been described as an example, but the present disclosure is not limited thereto. The present disclosure can also be applied to a display apparatus other than the liquid crystal display apparatus as long as it is a display apparatus using a direct backlight device.

This application claims priority based on Japanese Patent Application No. 2016-093050, which was entitled "backlight device, and display device provided with same" and filed on May 6, 2016, the contents of which, are incorporated herein by reference, in their entirety.

REFERENCE SIGNS LIST 61 chassis
62 LED substrate
63 blue LED
64 diffuser plate
65 phosphor sheet
66 optical sheet
67 reflection partition
400 liquid crystal panel
410 display unit
500 light source control unit
600 backlight device

The invention claimed is:

1. A backlight device of a direct type, comprising:
a light source unit that includes one or a plurality of blue light emitting elements which emit blue light;
a wavelength conversion sheet that converts a wavelength of the light emitted from the blue light emitting element so that a color of light emitted to an outside becomes white;
a reflection partition that is provided so as to surround the light source unit; and
a diffuser plate that diffuses the light emitted from the blue light emitting element, the diffuser plate being disposed at a portion between the light source unit and the wavelength conversion sheet,
wherein a predetermined interval is provided between the upper end of the reflection partition and the diffuser plate, and
wherein a surface of the reflection partition is blue.

2. The backlight device according to claim 1,
wherein the wavelength conversion sheet is a phosphor sheet including a phosphor which is excited by the light emitted from the blue light emitting element and emits light.

3. The backlight device according to claim 1,
wherein the wavelength conversion sheet is a quantum dot sheet including a quantum dot which converts the light emitted from the blue light emitting element into light having a green wavelength as an emission peak wavelength and a quantum dot which converts the light emitted from the blue light emitting element into light having a red wavelength as an emission peak wavelength.

4. A display apparatus comprising:
a display panel that includes a display unit which displays an image;
the backlight device according to claim 1 that is disposed so as to irradiate a back surface of the display panel with light; and
a light source control unit that controls light emission intensity of the blue light emitting element.

5. The display apparatus according to claim 4,
wherein the display unit is logically divided into a plurality of areas,
wherein the light source unit is provided so as to correspond to each area, and
wherein the light source control unit controls the light emission intensity of the blue light emitting element included in the light source unit for each area.

* * * * *